US010638600B2

(12) United States Patent
Tsukuda et al.

(10) Patent No.: US 10,638,600 B2
(45) Date of Patent: Apr. 28, 2020

(54) ELECTRONIC DEVICE

(71) Applicant: Renesas Electronics Corporation, Koutou-ku, Tokyo (JP)

(72) Inventors: Tatsuaki Tsukuda, Tokyo (JP); Akihiro Nakahara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/762,986

(22) PCT Filed: Nov. 30, 2015

(86) PCT No.: PCT/JP2015/083571
§ 371 (c)(1),
(2) Date: Mar. 23, 2018

(87) PCT Pub. No.: WO2017/094062
PCT Pub. Date: Jun. 8, 2017

(65) Prior Publication Data
US 2018/0295715 A1 Oct. 11, 2018

(51) Int. Cl.
H05K 1/02 (2006.01)
H01G 4/30 (2006.01)
(Continued)

(52) U.S. Cl.
CPC .............. H05K 1/0231 (2013.01); H01G 4/30 (2013.01); H01L 25/16 (2013.01); H05K 1/11 (2013.01);
(Continued)

(58) Field of Classification Search
CPC ......... H05K 1/11; H05K 1/0231; H05K 1/181
See application file for complete search history.

(56) References Cited

U.S. PATENT DOCUMENTS

2004/0065962 A1   4/2004  Shinomiya
2005/0001905 A1*  1/2005  Shinomiya ........... H04N 5/2251
                                              348/207.99
(Continued)

FOREIGN PATENT DOCUMENTS

JP    2003-008153 A    1/2003
JP    2004-128409 A    4/2004
(Continued)

OTHER PUBLICATIONS

International Search Report from International Patent Application No. PCT/JP2015/083571, dated Feb. 16, 2016.
(Continued)

Primary Examiner — William H. Mayo, III
Assistant Examiner — Hiram E Gonzalez
(74) Attorney, Agent, or Firm — SGPatents PLLC

(57) ABSTRACT

An electronic device according to one embodiment includes a wiring substrate, the wiring substrate having a first wiring connected to a first external terminal and a second wiring connected to a second external terminal and extending along the first wiring. Additionally, the above electronic device has a semiconductor device mounted on the above wiring substrate and electrically connected to each of the first and second wirings. Further, the above electronic device has a capacitor mounted on the above wiring substrate and electrically connected to the semiconductor device via each of the above first and second wirings. Furthermore, a distance between the above semiconductor device and capacitor is shorter than a distance between each of the above first and second external terminals and the above capacitor.

10 Claims, 24 Drawing Sheets

(51) Int. Cl.
*H01L 25/16* (2006.01)
*H05K 1/11* (2006.01)
*H05K 1/18* (2006.01)
*H01G 4/248* (2006.01)

(52) U.S. Cl.
CPC ............ *H01G 4/248* (2013.01); *H05K 1/181* (2013.01); *H05K 2201/09227* (2013.01); *H05K 2201/09236* (2013.01); *H05K 2201/09254* (2013.01); *H05K 2201/10015* (2013.01); *H05K 2201/10378* (2013.01); *H05K 2201/10636* (2013.01); *H05K 2201/10689* (2013.01)

(56) References Cited

U.S. PATENT DOCUMENTS

| | | | |
|---|---|---|---|
| 2005/0230845 | A1 | 10/2005 | Shinomiya |
| 2006/0066417 | A1 | 3/2006 | Yamanaga et al. |
| 2007/0018307 | A1 | 1/2007 | Shinomiya |
| 2014/0049929 | A1* | 2/2014 | Yamaguchi .......... H05K 1/0216 361/782 |
| 2015/0107888 | A1* | 4/2015 | Uemichi ............. H04L 25/0272 174/262 |
| 2015/0359119 | A1* | 12/2015 | Ota .................. H01L 23/13 361/752 |
| 2015/0364261 | A1* | 12/2015 | Takahashi ............. H01G 4/06 361/301.4 |

FOREIGN PATENT DOCUMENTS

| | | |
|---|---|---|
| JP | 2005-027041 A | 1/2005 |
| JP | 2006-128618 A | 5/2006 |
| JP | 2006-135064 A | 5/2006 |
| JP | 2009-129979 A | 6/2009 |
| JP | 2012-164817 A | 8/2012 |
| JP | 2013-236360 A | 11/2013 |
| WO | WO 2014/038542 A1 | 3/2014 |

OTHER PUBLICATIONS

Office Action dated Nov. 13, 2018, in Japanese Patent Application No. 2017-553491.
Office Action, dated Jun. 26, 2019, in European Patent Application No. 15909692.4.
Office Action, dated May 7, 2019, in Japanese Patent Application No. 2017-553491.
Office Action dated Dec. 4, 2019, in Chinese Patent Application No. 201580084020.4.

* cited by examiner

ELECTRONIC DEVICE

TECHNICAL FIELD

The present invention relates to, for example, an electronic device having a wiring substrate on which a semiconductor device and a capacitor are mounted.

BACKGROUND ART

For example, Japanese Patent Application Laid-open No. 2013-236360 (Patent Document 1) discloses that a power supply wiring and a reference potential supply wiring for phase locked loop in a semiconductor device are coupled for suppressing crosstalk noise. Additionally, the coupled power supply wiring and reference potential supply wiring are connected to a capacitor.

RELATED ART DOCUMENTS

Patent Documents

Patent Document 1: Japanese Patent Application Laid-open No. 2013-236360

SUMMARY OF THE INVENTION

Problems to be Solved by the Invention

The semiconductor devices are used in various applications. However, a technique of reducing noise influencing operations of the semiconductor devices becomes necessary from the viewpoint of causing the semiconductor devices to operate stably. A method of mounting noise suppression parts such as capacitors on a wiring substrate on which the semiconductor device is mounted is considered to be a mothed of reducing the noise influencing the operation of the semiconductor device. However, it has been understood that there is room for improvement from the viewpoint of effectively reducing the noise.

Other objects and novel characteristics of the present invention will be apparent from the description of the present specification and the accompanying drawings.

Means for Solving the Problems

An electronic device according to one embodiment includes a wiring substrate, the wiring substrate having a first wiring connected to a first external terminal and a second wiring connected to a second external terminal and extending along the first wiring. Additionally, the above electronic device has a semiconductor device mounted on the above wiring substrate and electrically connected to each of the first and second wirings. Further, the above electronic device has a capacitor mounted on the above wiring substrate and electrically connected to the semiconductor device via each of the above first and second wirings. Furthermore, a distance between the above semiconductor device and capacitor is shorter than a distance between each of the above first and second external terminals and the above capacitor.

EFFECTS OF THE INVENTION

According to the above embodiment, reliability of the electronic device in which the semiconductor device is mounted can be improved.

BRIEF DESCRIPTIONS OF THE DRAWINGS

Figure 1:
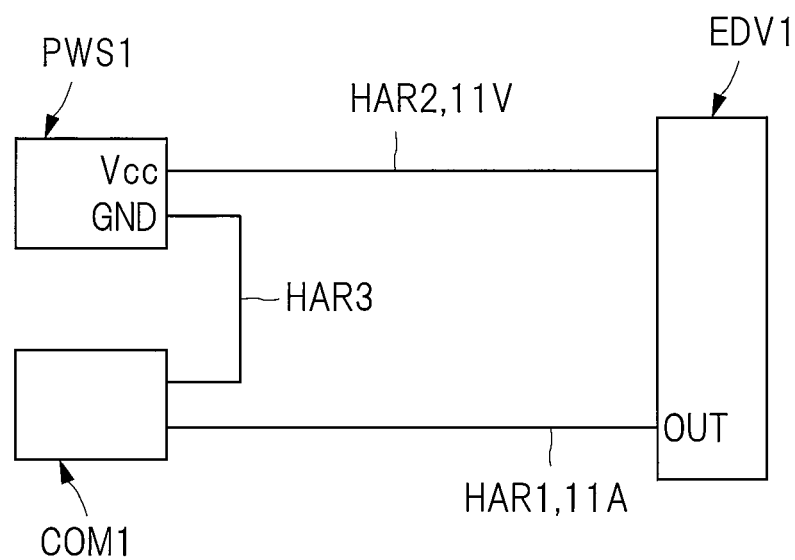
FIG. 1 is an explanatory diagram schematically showing a configuration example of a system that controls electronic components by an electronic device.

DETAILED DESCRIPTION OF PREFERRED EMBODIMENTS (Description of Format, Basic Terms, and Description of Usage in the Present Application)

In this application, embodiments will be described in a plurality of sections or the like when required as a matter of convenience. However, these sections are not independent and irrelevant to each other unless otherwise stated, and the one relates to the entire or a part of the other as a detail, a modification example or the like regardless of the order of descriptions. In addition, the description of the same or similar portions is not repeated in principle. Further, the components in the embodiments are not always indispensable unless otherwise stated or except for the case where the components are logically limited to that number and the components are apparently indispensable from the context.

Similarly, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise indicated clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar components are denoted by the same or similar reference character or reference number, and the descriptions thereof are not repeated in principle.

In addition, in the attached drawings, hatching may be omitted even in cross sections in the case where it becomes rather complicated or the case where discrimination from void is clear. In this regard, when it is clear from the description or the like, an outline of a background may be omitted even in a planarly closed hole. Furthermore, even other than the cross section, hatching or dot patterns may be drawn so as to clarify non-voids or clarify a boundary of regions.

(Embodiment)

<Use Example of Electronic Device>

Figure 2:
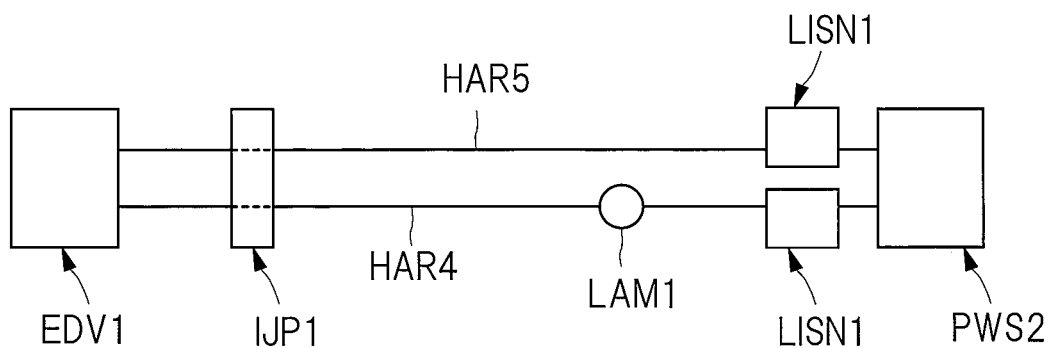
FIG. 2 is an explanatory diagram showing a configuration example of a testing device that tests noise resistance of the electronic device shown in FIG. 1.

Firstly, an example of use application of an electronic device according to the present embodiment will be explained with reference to FIG. 1. FIG. 1 is an explanatory diagram schematically showing a configuration example of a system that controls electronic components by an electronic device. Additionally, FIG. 2 is an explanatory diagram showing a configuration example of a testing device that tests noise resistance of the electronic device shown in FIG. 1.

Semiconductor devices are incorporated into various appliances and used as control components with downsizing and functionalization of the semiconductor devices. For example, when an automobile or motorized two-wheeled vehicle is taken as an example, drive control for a power system such as an engine or motor, operation control of various components for transmitting power to tires, control for an optical component such as an illumination lamp or indicator, operation control of a door or window, or the like is used for controlling various components. By using the semiconductor device to construct a control system, the control system can be functionalized. Or, by using the semiconductor device to construct a control system, the control system can be downsized.

When the electronic device for control is incorporated into a large-sized appliance like the automobile or motorized two-wheeled vehicle, a distance between a component that is an object to be controlled and the electronic device is remote in many cases. For example, a drive circuit etc. of each component that is an object to be controlled is preferably placed near each component. Meanwhile, in view of considering operatability and maintainability of an operator, controller components such as control circuits are preferably gathered and arranged in one area of the appliance. As a result, the distance between the control circuit and each component becomes large.

When the distance between the component that is the controlled object and the electronic device is remote similarly to the present embodiment, any way becomes necessary for electrically connecting the component and the electronic device. For example, in a control system shown in FIG. 1, an electronic device EDV1 that is a controlling component and a component COM1 that is a controlled component are electrically connected via a wire HAR1. Additionally, power supply PWS1 and the electronic device EDV1 that is a controlling component are electrically connected via a wire HAR2. The wire HAR1 or the wire HAR2 shown in FIG. 1 may be an aggregate wiring (harness) obtained by bundling a plurality of wiring paths.

Additionally, a component COM1 that is a controlled component has various modification examples as described above. However, the present embodiment will be explained as an example of the component COM1 by taking up direction indicators attached to the motorized two-wheeled vehicle. Further, a semiconductor device that the electronic device EDV1 has includes a control circuit for controlling (relay controlling) an operation (lighting-on operation, lighting-off operation, or blinking operation) of the direction indicators.

In the example shown by FIG. 1, a power supply potential Vcc is transmitted to the electronic device EDV1 from power supply PWS1 via the wire HAR2 (power supply line 11V). Additionally, an output potential (or output signal) OUT from the electronic device EDV1 is transmitted to the component COM1 from the electronic device EDV1 via the wire HAR1 (output line 11A). Further, a reference potential GND is transmitted to the component COM1 from the power supply PWS1 via a wire HAR3. For those reasons, by the control circuit that the electronic device EDV1 has in the control system shown in FIG. 1, drive of the component COM1 is controlled.

When the wire HAR1 or the wire HAR2 is respectively connected between the controlling component and the power supply PWS1 or between the controlling component and the controlled component as shown in FIG. 1, noise applied from the wire HAR1 or the wire HAR2 influences an operation characteristic of the control circuit in some cases. If a length of the wire HAR1 or the wire HAR2 becomes large, a possibility that an electromagnetic wave will be applied to the wire HAR1 or HAR2 is increased. Therefore, in view of improving reliability of the control system, noise resistance of the electronic device EDV1 having the control circuit is preferably improved.

An influence on the operation characteristic of the control circuit due to noise applied from the wire(s) connected to the electronic device EDV1 can be evaluated by using, for example, a testing device shown in FIG. 2. The testing device shown in FIG. is a testing device for conducting an immunity test. More specifically, the test conducted by the testing device shown in FIG. 2 is called a bulk current injection (BCI) test, and is a testing device for conducting the immunity test set by the ISO standard (ISO11452-4).

In the testing device shown in FIG. 2, the electronic device EDV1 that is an object to be tested and the power supply PWS2 are electrically connected to each other via a plurality of wires HAR4, HAR5. Additionally, an artificial mains network LISN1 is connected between the power supply PWS2 and the electronic device EDV1 on each of the wires HAR4 and HAR5. Further, the wires HAR4 and HAR5 are bundled, and are inserted into a coil (injection probe) IJP1 placed near the electronic device EDV1. During the BCI test, a current flows in the coil IJ1 to make noise artificially occur, and the noise resistance of the electronic device EDV1 that is a tested object is evaluated.

When the noise resistance of the electronic device EDV1 is evaluated, an output signal from the electronic device EDV1 may be detected and evaluated. In the present embodiment, the component COM1 shown in FIG. 1 is a direction indicator as described above. For this reason, a lamp LAM1 is placed in a wiring path of the wire HAR4 in an example shown in FIG. 2, and the noise resistance of the electronic device EDV1 is evaluated based on a lighting-on operation of the lamp LAM1. For example, when the current flows in the coil IJP1, the electronic device EDV1 is affected by the noise, which brings a change in blinking speed of the lamp LAM1. Then, when the blinking speed of the lamp LAM1 exceeds a predetermined allowable range (threshold value), it can be determined that the electronic device EDV1 performs a false operation.

<Electronic Device>

Figure 3:
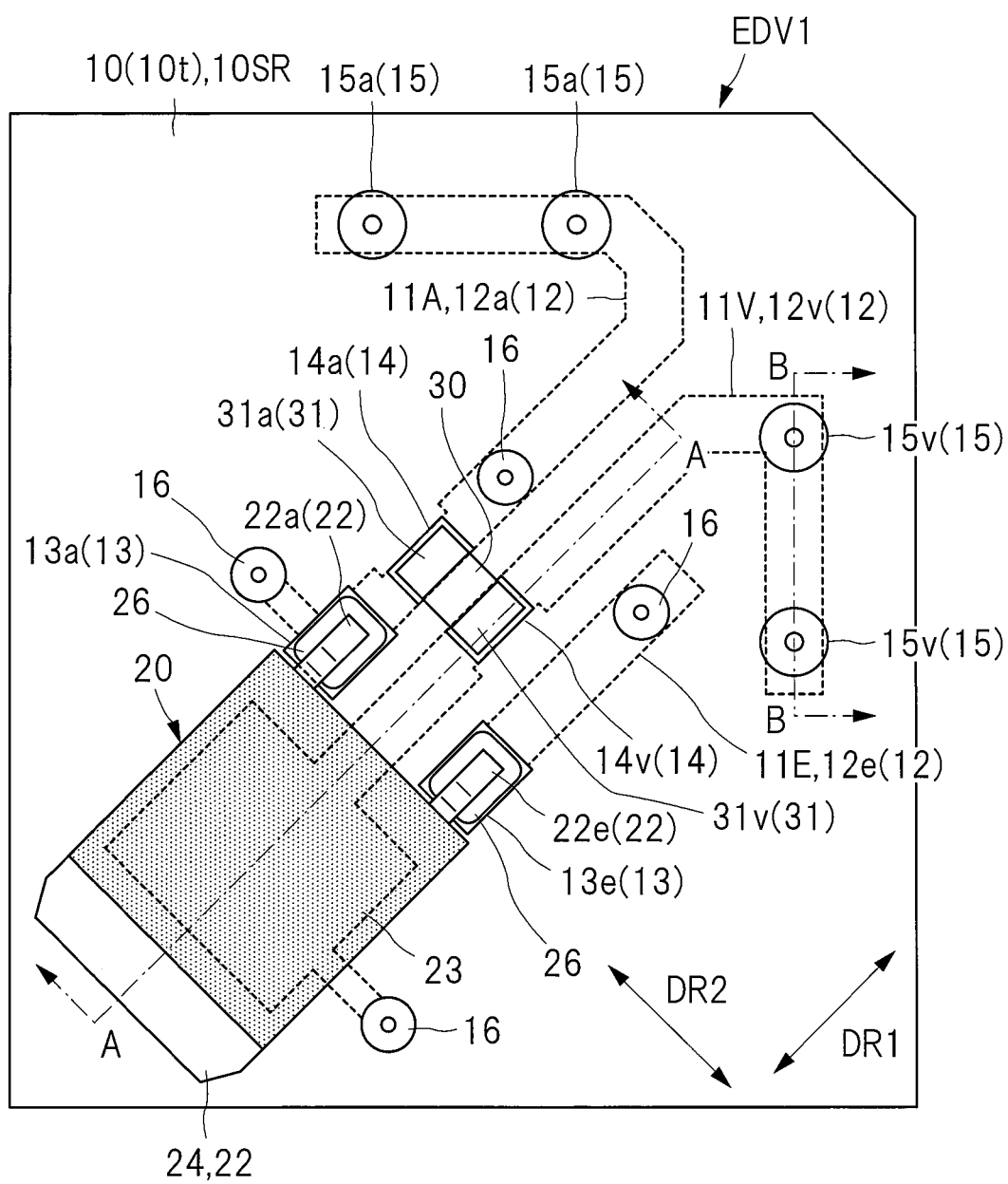
FIG. 3 is a plan view showing a structure example of the electronic device shown in FIG. 2.
Figure 4:
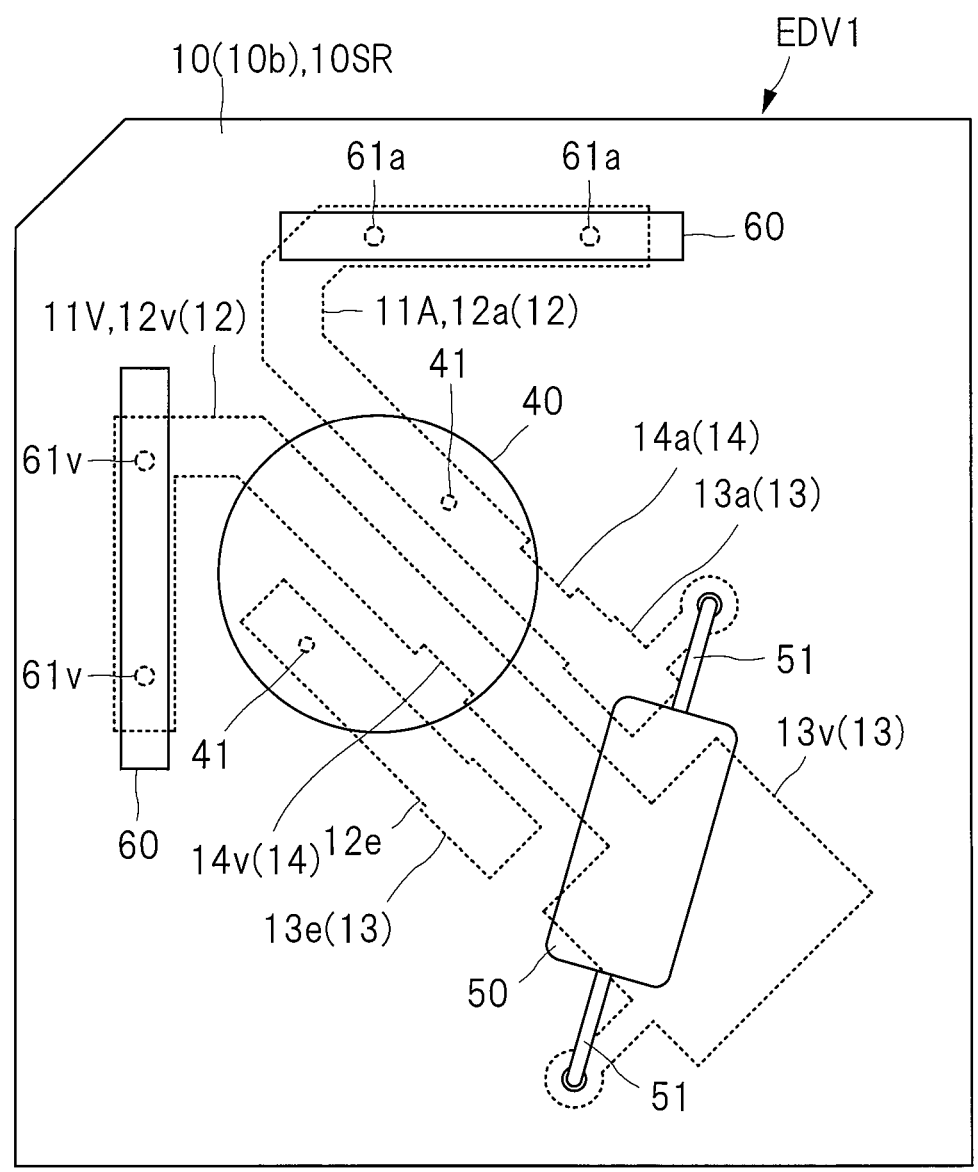
FIG. 4 is a plan view of an opposite surface of the electronic device shown in FIG. 3.
Figure 5:
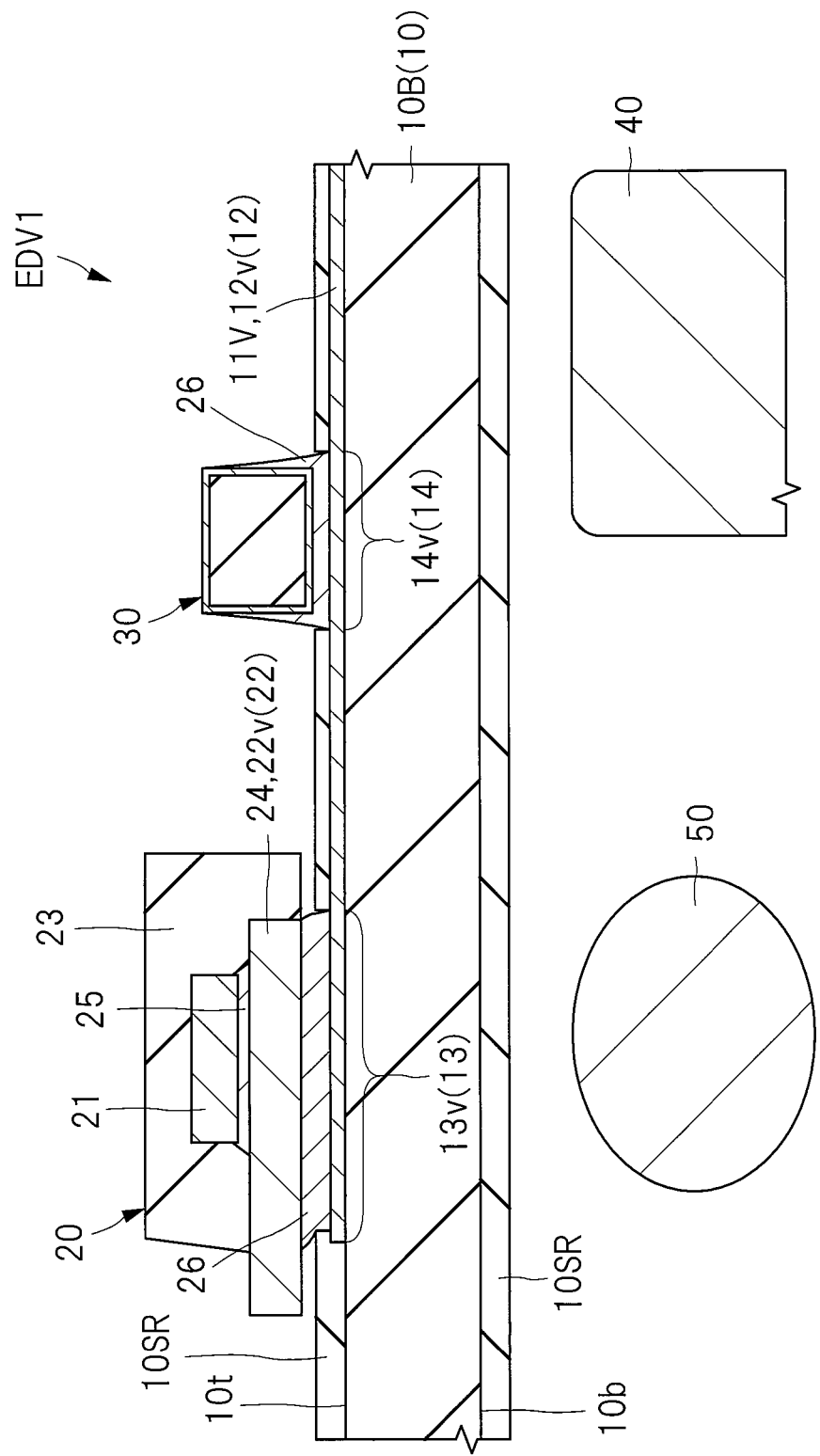
FIG. 5 is an enlarged sectional view taken along line A-A of FIG. 3.
Figure 6:
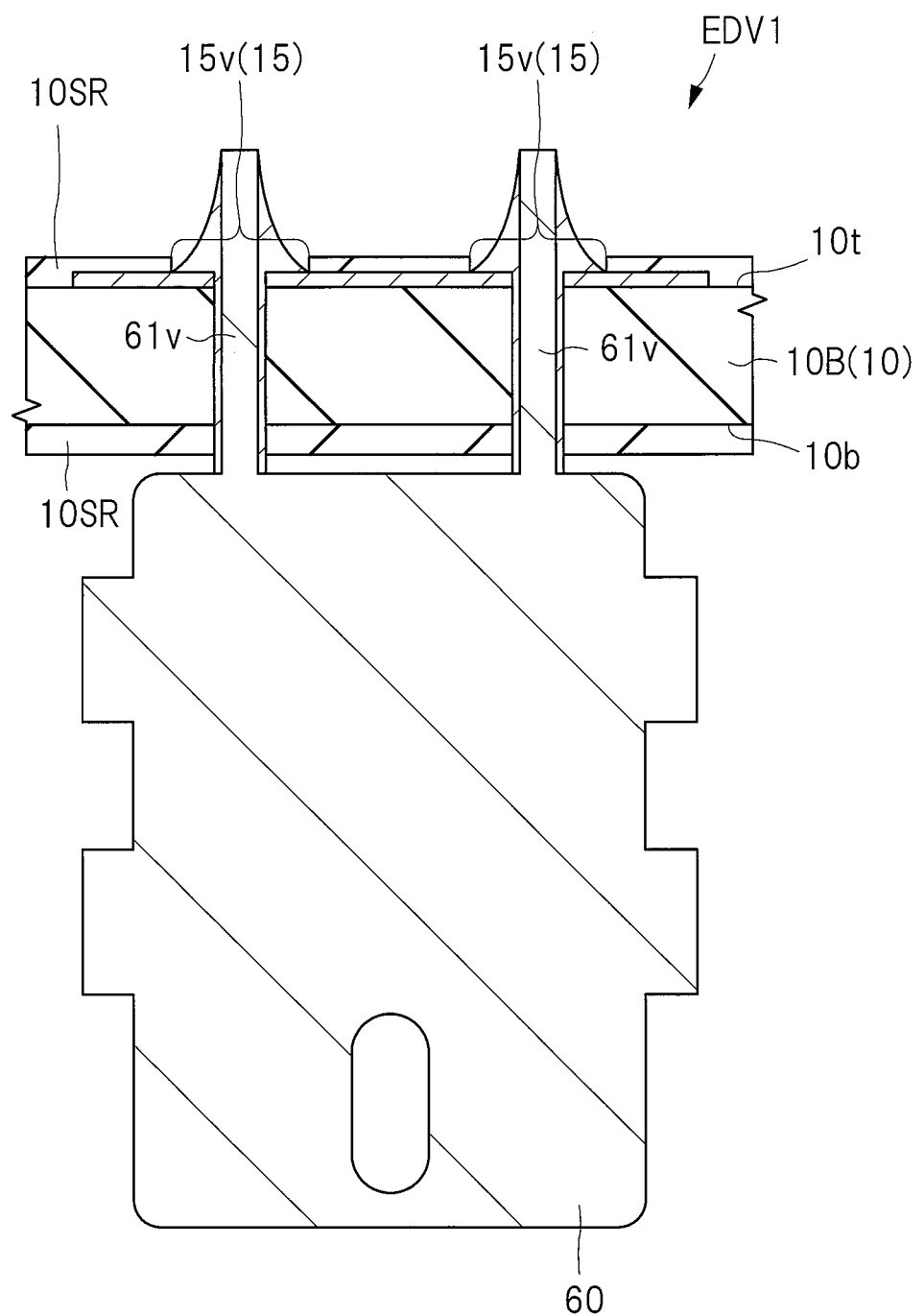
FIG. 6 is an enlarged sectional view taken along line B-B of FIG. 3.
Figure 7:
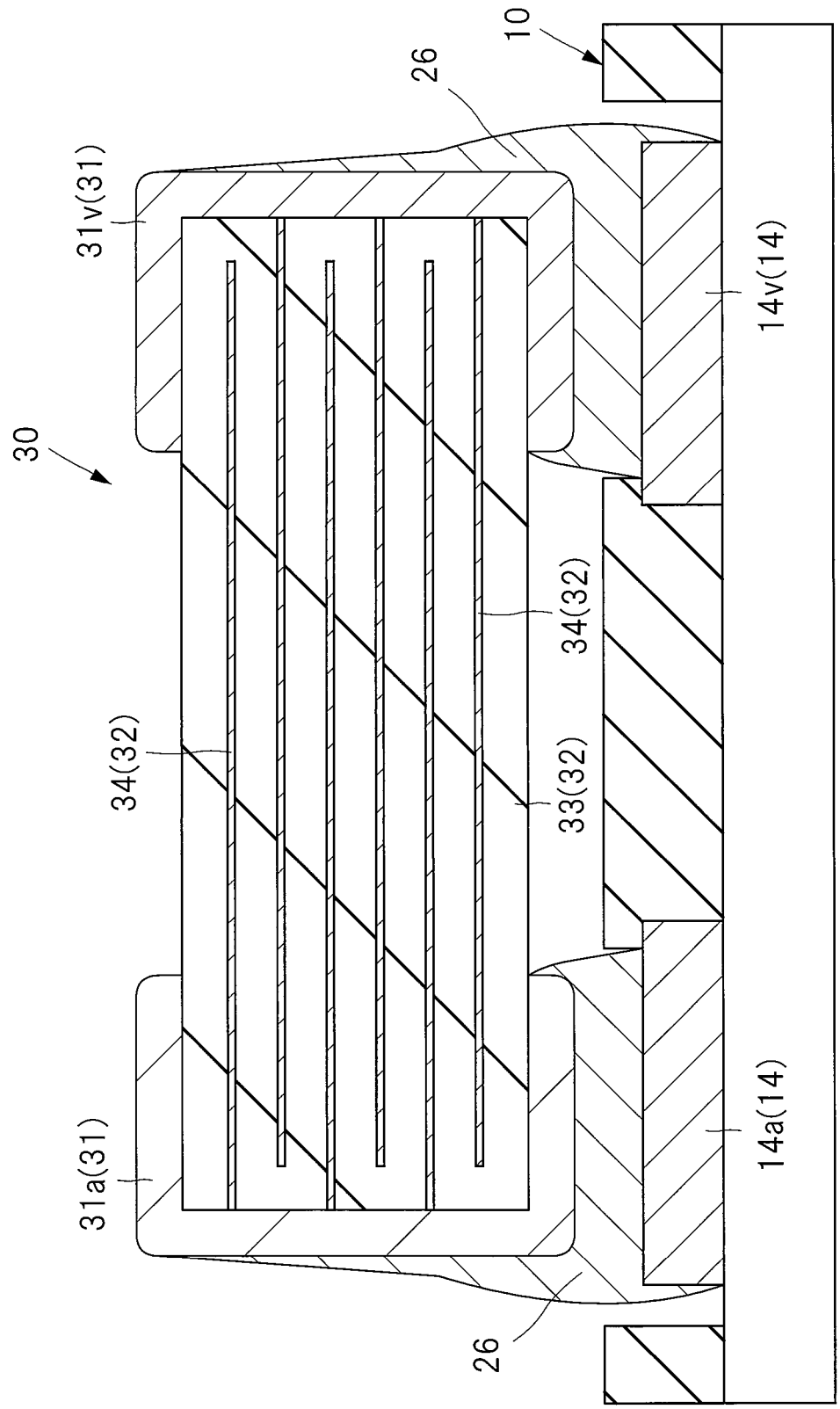
FIG. 7 is an enlarged sectional view of a capacitor shown in FIG. 3.
Figure 8:
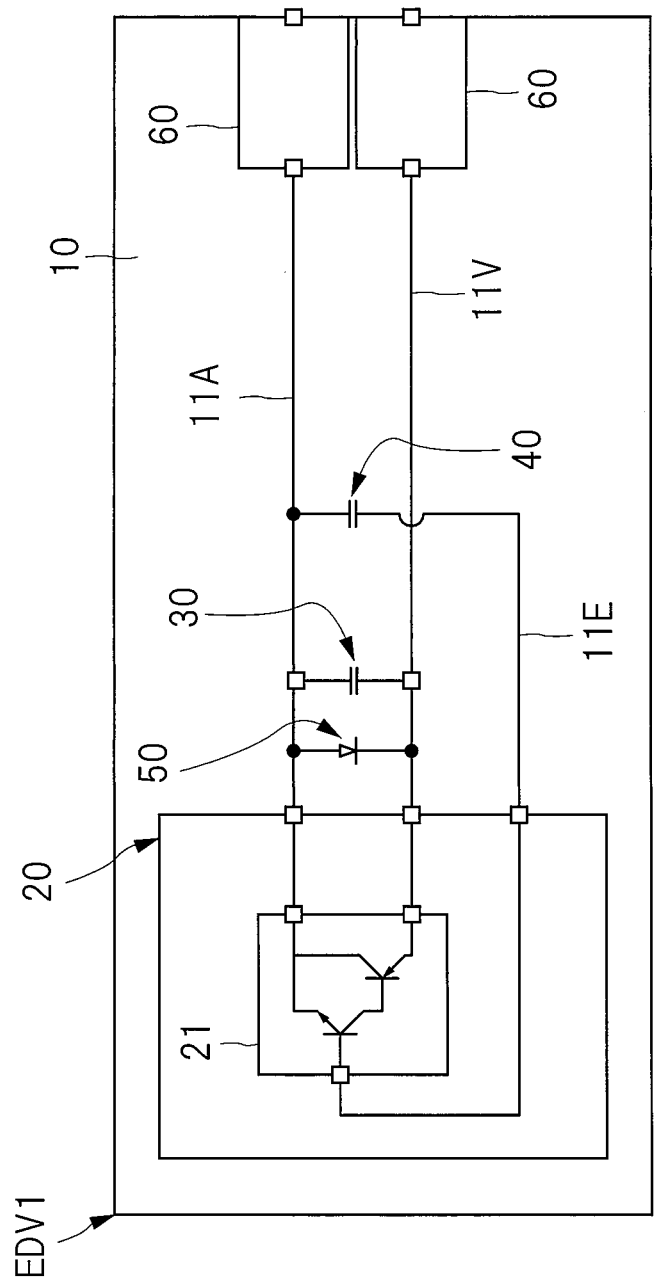
FIG. 8 is an equivalent circuit diagram of the electronic device shown in FIG. 3.

Next, a configuration example of the electronic device EDV1 shown in FIGS. 1 and 2 will be explained. FIG. 3 is a plan view showing a structure example of the electronic device shown in FIG. 2. FIG. 4 is a plan view of an opposite surface of the electronic device shown in FIG. 3. FIG. 5 is an enlarged sectional view taken along line A-A of FIG. 3. FIG. 6 is an enlarged sectional view taken along line B-B of FIG. 3. FIG. 7 is an enlarged sectional view of a capacitor shown in FIG. 3. Additionally, FIG. 8 is an equivalent circuit diagram of the electronic device shown in FIG. 3.

Incidentally, in the present embodiment as shown in FIGS. 5 and 6, each of a plurality of wirings 12 is formed on a main surface 10t side, and is covered with an insulating film 10SR. However, in order to explicitly show each planar shape of the wirings 12, each outline of the wirings 12 shown in FIGS. 3 and 4 is indicated by dotted lines. Additionally, FIG. 8 shows, as an example of a circuit formed on a semiconductor chip 21, an oscillator circuit having two bipolar transistors. However, a circuit(s) that the semiconductor chip 21 has includes various modification examples. For example, the semiconductor chip may include a circuit (s) other than the oscillator circuit. For example, also used as a transistor may be a metal oxide semiconductor field effect transistor (MOSFET).

As shown in FIGS. 3 and 4, the electronic device EDV1 according to the present embodiment is a structure body in which a plurality of components are mounted on a wiring substrate 10 serving as abase material and each component is electrically connected via the wiring 12. As shown in FIG. 3, the electronic device EDV1 has a semiconductor device 20 and a capacitor 30 that are mounted on a main surface 10t of the wiring substrate 10. Additionally, as shown in FIG. 4, the electronic device EDV1 has a capacitor 40, a diode 50, and a plurality of external terminals (connectors) 60 that are mounted on a main surface 10b of the wiring substrate 10.

The wiring substrate 10 has the main surface (surface, front surface, upper surface, semiconductor-device mounting surface) 10t as shown in FIG. 3, and the main surface (surface, back surface, lower surface, external-terminal mounting surface) 10b (see FIG. 4) opposite to the main surface 10t. In an example of the present embodiment as shown in FIG. 5, the wiring substrate 10 has a base material 10B made of an insulating material, and the base material 10B has the main surface 10t and the main surface 10b. Each of the main surface 10t and the main surface 10b of the base material 10B is covered with an insulating film (solder resist film).

Additionally, the wiring substrate 10 has the plurality of wirings 12. As shown in FIG. 3, the plural wirings 12 include a wiring 12v constituting a power supply line (wiring path) 11V that supplies a power supply potential to the semiconductor device 20. Additionally, the plural wirings 12 include a wiring 12a constituting an output line (wiring path) 11A to which a potential (signal) outputted from the semiconductor device 20 is transmitted. Further, the example shown by FIG. 3 includes a wiring 12e electrically connecting the semiconductor device 20 and an oscillator-circuit capacitor 40 (see FIG. 4) in a wiring path 11E different from the power supply line 11V and the output line 11A.

Incidentally, the following explanation will be made if it is assumed that the respective wiring paths like the power supply line 11V and the output line 11A, etc. are constituted by a single wiring 12v and a single wiring 12a and each part of the wirings 12v and 12a becomes a connection 13, connection 14, or connection 15. In other words, however, the connection 13, connection 14, connection 15, and the wirings 12 electrically connecting those connections can be also considered to be separate components. In this case, the respective wiring paths like the power supply line 11V and the output line 11A, etc. can be described as having the connection 13, the connection 14, and the connection 15 to be connected via the plural wirings 12v and 12a.

In the present embodiment, each of the plural wirings 12 is also formed on a main surface 10t side of the wiring substrate 10. Each of the plural wirings 12 is a metal pattern formed by a metal material such as copper. As shown in FIG. 5, each of the plural wirings 12 is slenderly patterned so as to electrically connect a plurality of components (e.g., semiconductor device 20, capacitor 30, diode 50, and external terminal 60, etc.) mounted on the wiring substrate 10. In other words, each of the plural wirings 12 may have: an extension direction that extends so as to electrically connect the plural components mounted on the wiring substrate 10; and a width direction orthogonal to the extension direction, and a length of the above width direction is shorter than a length of the above extension direction.

Additionally, each of the plural wirings 12 is mostly covered with an insulating film 10SR as shown in FIGS. 5 and 6. The insulating film 10SR is partially provided with an opening, and respective parts of the wirings 12 are exposed from the insulating film 10SR in the opening. In exposed portions from the insulating film 10SR among the wirings 12, the semiconductor device 20 and capacitor 30 shown in FIG. 5 and an electrode portion of the external terminal 60 shown in FIG. 6 are electrically connected.

In other words, the exposed portions from the insulating film 10SR among the wirings 12 function as connections (device connection, capacitor connection, and external connection) for electrically connecting the plural components (e.g., semiconductor device 20, capacitor 30, capacitor 40, diode 50, and external terminal 60, etc.) mounted on the wiring substrate 10. Each of the plural connections (device connections) 13, the plural connections (capacitor connections) 14, the plural connections (external-terminal connections) 15, and the plural connections (electronic-device connections) 16 as shown in FIG. 3 is formed integrally with the wirings 12.

More specifically, the wiring 12a constituting the output line 11A has a connection 13a connected to a terminal 22a of the semiconductor device 20, a connection 14a connected to an electrode 31a of the capacitor 30, and a connection 15a connected to an electrode (pin) 61a (see FIG. 4) of the external terminal 60 (see FIG. 6). In other words, the respective connections 13a, 14a, and 15a are electrically connected to each other via the wirings 12. Additionally, the wiring 12v constituting the power supply line 11V has a connection 13v (see FIG. 5) connected to the terminal 22v (see FIG. 5) of the semiconductor device 20, a connection 14v connected to the electrode 31v of the capacitor 30, and a connection 15v connected to the electrode (pin) 61v (see FIG. 4) of the external terminal 60 (see FIG. 6). In other words, each of the connections 13v, 14v, and 15v is electrically connected to each other via the wirings 12v.

Additionally, as shown in FIG. 3, mounted on the main surface 10t of the wiring substrate 10 is the semiconductor device 20. The semiconductor device 20 has a control circuit that controls the component COM1 shown in FIG. 1. As described above, the component COM1 shown in FIG. 1 in the present embodiment is the direction indicator attached to the motorized two-wheeled vehicle, and the semiconductor device 20 has a control circuit that controls an operation (lighting-on operation, lighting-off operation, or blinking operation) of the direction indicator. The semiconductor device 20 is a semiconductor package having: the semiconductor chip 21 (see FIG. 5) in which the above control circuit is formed; a plurality of terminals (device terminal, lead terminal) 22 electrically connected to the semiconductor chip 21; and a sealing body (resin body) 23 sealing the semiconductor chip 21.

The semiconductor device 20 is electrically connected, via the plural terminals 22, to the wirings 12v, 12a, and 12e on the wiring substrate 10. More specifically, as shown in FIG. 3, the terminal (lead terminal) 22a among the plural terminals 22 that the semiconductor device 20 has is electrically connected to the wiring 12a, and constitutes a part of the output line 11A. The terminal 22a is electrically connected via a solder material 26 to the connection (device connection) 13a that is formed on the wiring substrate 10. The terminal 22v (see FIG. 5) among the plural terminals 22 that the semiconductor device 20 has is electrically connected to the wiring 12v and constitutes a part of the power supply line 11V. The terminal 22v is electrically connected via the solder material 26 to the connection (device connection) 13v that is formed on the wiring substrate 10. The terminal (lead terminal) 22e among the plural terminals 22 that the semiconductor device 20 has is electrically connected to the wiring 12e. The terminal 22e is electrically connected via the solder material 26 to the connection (device connection) 13e that is formed on the wiring substrate 10.

Incidentally, the semiconductor chip 21 in the example shown by FIG. 5 is mounted on or over a die pad 24. The semiconductor chip 21 is fixed to the die pad 24 via a die bond material 25. The die bond material 25 is a conductive member such as a solder material or conductive adhesive, and the semiconductor chip 21 is electrically connected to the die pad 24. The die pad 24 is electrically connected via the solder material 26 to the connection 13v that is formed on the main surface 10t of the wiring substrate 10. Namely, the die pad 24 that the semiconductor device 20 of the present embodiment has functions as a terminal 22v that electrically connects the semiconductor chip 21 and the connection 13v.

Additionally, mounted on the main substrate 10t of the wiring substrate 10 is the capacitor 30 as shown in FIG. 3. The capacitor 30 as shown in FIG. 8 has one electrode connected to the power supply line 11V, and the other electrode connected to the output line 11A. When the capacitor 30 is connected between the power supply line 11V and the output line 11A, noise flowing through the power supply line 11V or output line 11A can be filtered. Called a bypass capacitor is a capacitor that is connected in parallel and inserted between the power supply line 11V and the output line 11A similarly to the capacitor 30 and that filters noise flowing through the power supply line 11V or output line 11A.

In the example shown by FIG. 3, a connection 13a to which an electrode 31a of the capacitor 30 is connected is placed on the way of a direction DR1 in which the wiring 12a extends. A connection 13v to which an electrode 31v of the capacitor 30 is connected is placed on the way of the direction DR1 in which the wiring 12v extends. Additionally, the capacitor 30 is mounted across the wirings 12a and 12v so as to line up the electrodes 31a and 31v along a direction DR2 intersecting with (in FIG. 3, orthogonal to) the direction DR1.

As shown in FIG. 3, the capacitor (chip capacitor) 30 is formed like a quadrangle in a plan view. The capacitor also has two long sides (long side surfaces) and two short sides (shot side surfaces). The capacitor 30 has the electrodes 31a and 31v that are provided to ends opposite to each other. The two electrodes 31 in the present embodiment are positioned at the ends opposite to each other in an extension direction of the long side of the capacitor 30. The capacitor 30 also has a main body 32 sandwiched between the electrodes 31a and 31v. As shown in, for example, FIG. 7, the main body 32 has a plurality of conductor plates 34 each stacked via an insulating layer (dielectric layer) 33, and each of the plural conductor plates 34 is connected to one of the electrodes 31a and 31v. The electrodes 31a and 31v function as external terminals for taking out, outside, capacity formed between the plural conductor plates arranged oppositely.

The capacitor 30 having a structure shown in FIG. 7 uses a ceramic insulating layer 33 in many cases, and is called a ceramic capacitor. Additionally, the capacitor 30 shown in FIG. 7 is a surface mounting type electronic component that can be mounted on a front surface of the wiring substrate 10. The surface mounting type electronic component is called a chip component (chip capacitor in a case of the capacitor 30).

Meanwhile, a capacitor 40 shown in FIGS. 4 and 5 is a capacitor in which a not-shown conductor plate is subjected to a chemical treatment (s) to form an insulating film (or semiconductor film) such as an oxide film on a front surface of an electrode and this insulating film is used as a dielectric. The capacitor 40 obtains predetermined capacity by stacking conductor plates each subjected to a surface treatment(s).

However, gaps among the stacked conductor plates are filled with an electrolytic solution so that the solution is embedded in the gaps. For this reason, a capacitor having a structure of the capacitor 40 is called an electrolytic capacitor. In this case, the electrolytic capacitor has bar-shaped (pin type) electrodes 41 (see FIG. 4). In the present embodiment, the electrode 41 of the capacitor 40 is inserted into a through hole of the wiring substrate 10, and an inserted portion is fixed by a solder material. The portion in which the electrode 41 has been inserted is provided with a connection 16 (see FIG. 3), and the connection 16 and the electrode 41 are electrically connected via a solder material.

The capacitor 30 that is a ceramic capacitor has a volume and a mounting area smaller than those of the capacitor 40 that is an electrolytic capacitor. The capacitor 30 has capacity smaller than that of the capacitor 40. For example, the capacitor 30 has a capacity of about 0.1 µF to 10 µF. Meanwhile, the capacitor 40 has a capacity of about 22 µF to 100 µF.

Incidentally, the example of the structure of the capacitor has been explained in the above, but there are various modification examples about the structure and capacity of the capacitor 30.

Additionally, as shown in FIG. 4, mounted on the main surface 10b of the wiring substrate 10 are a plurality of external terminals 60. The external terminals 60 are terminals for external interfaces of the electronic device EDV1, and are connectors for electrically connecting the plural wirings 12 in the electronic device and the wires HAR1 and HAR2 shown in FIG. 1. The external terminals 60 are made large components in size in view of connectability with the wires HAR1 and HA2 shown in FIG. 1. For example, a surface area of the external terminal 60 in the present embodiment is larger than each of surface areas of the capacitor 30 and the semiconductor device 20 as shown in FIG. 3. Although detailed later, a case of inserting the large surface-area external terminal 60 into the way of power supply line 11V and output line 11A shown in FIG. 1 needs to consider an influence of noise due to the external terminal 60 itself.

Additionally, as shown in FIG. 4, mounted on the main surface 10b of the wiring substrate 10 are electronic components such as the capacitor 40 and the diode 50. In the present embodiment as shown by FIG. 8, one electrode of the capacitor 40 is connected to the output line 11A, and the other electrode thereof is connected to a wiring path 11E different from the power supply line 11V and the output line 11A. In an example shown by FIG. 8, the wiring path 11E is connected to an input terminal (base terminal or gate terminal) of a transistor that the semiconductor chip 21 has. A circuit shown by FIG. 8 operates as an oscillator circuit that alternately repeats a state (on-state) of supplying an output potential from the output line 11A, and a state (off-state) of supplying no output potential. As shown in FIG. 1, the output line 11A is connected to the component COM1 that is on a load side, and a potential to be supplied to the component COM1 performs on and off-operations. In the present embodiment as described above, since the component COM1 is a direction indicator, the direction indicator performs a blinking operation by the on and off-operations of the output potential. An interval of the blinking operations is determined by a value of capacity of the capacitor 40 shown in FIG. 8 and a value of resistance included in the oscillator circuit.

Additionally, in the present embodiment, an anode electrode of the diode 50 shown in FIG. 8 is connected to the output line 11A, and a cathode electrode is connected to the power supply line 11V. The diode 50 has bar-shaped (pin type) electrodes 51 (see FIG. 4). In the present embodiment, the electrode 51 of the diode 50 is inserted into a through hole of the wiring substrate 10, and an inserted portion is fixed by a solder material. The portion in which the electrode 51 is inserted is provided with a connection 16 (see FIG. 3), and the connection 16 and the electrode 51 are electrically connected via a solder material. Incidentally, the electronic component such the capacitor 40 or diode 50 is a component to be mounted in accordance with a specification of the electronic device EDV1, and may not be mounted depending on the circuit of the electronic device EDV1.

<Relation Between Noise and Layout>

Figure 9:
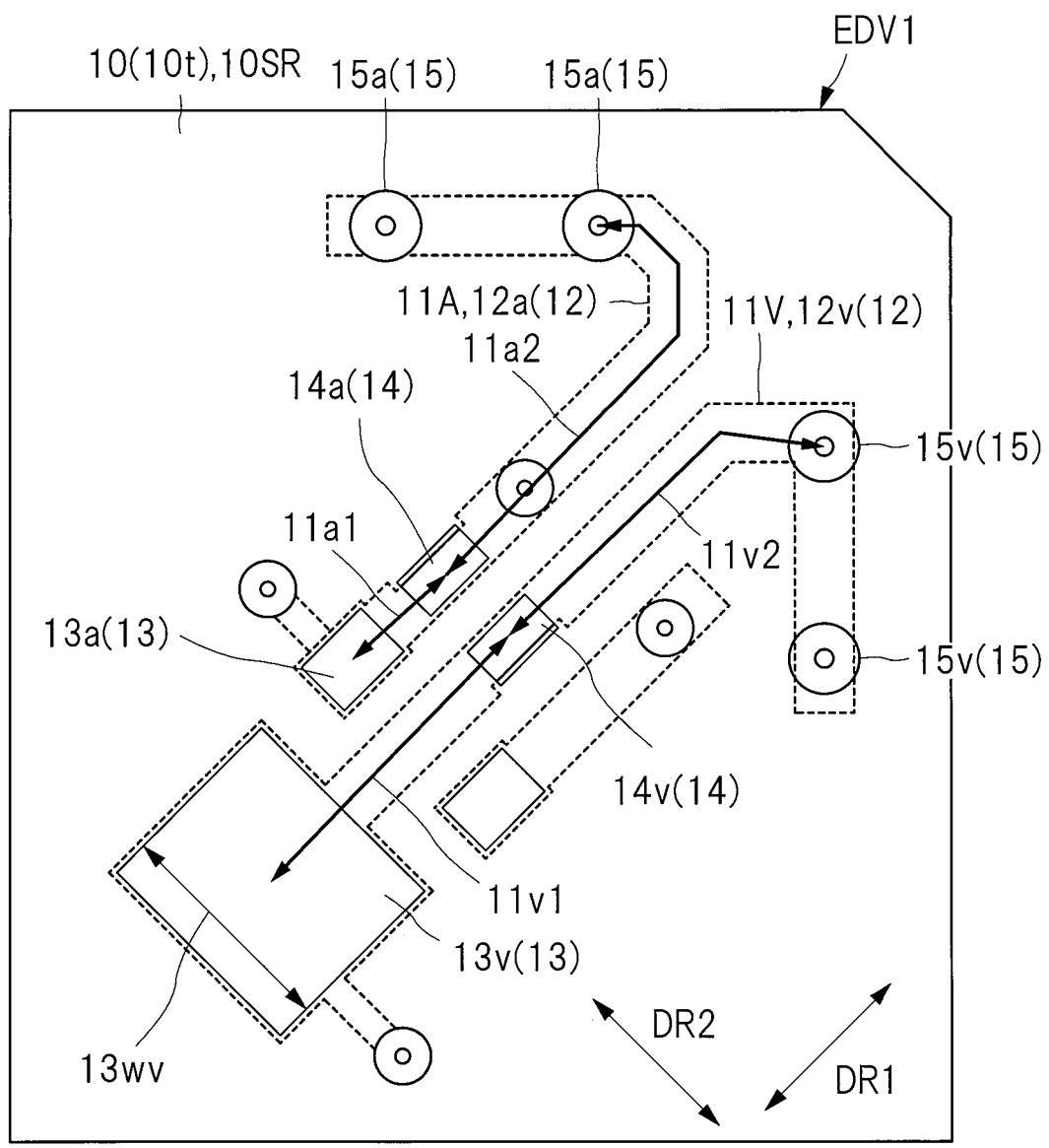
FIG. 9 is a plan view of a wiring substrate from which the semiconductor and capacitor shown in FIG. 3 are removed.
Figure 10:
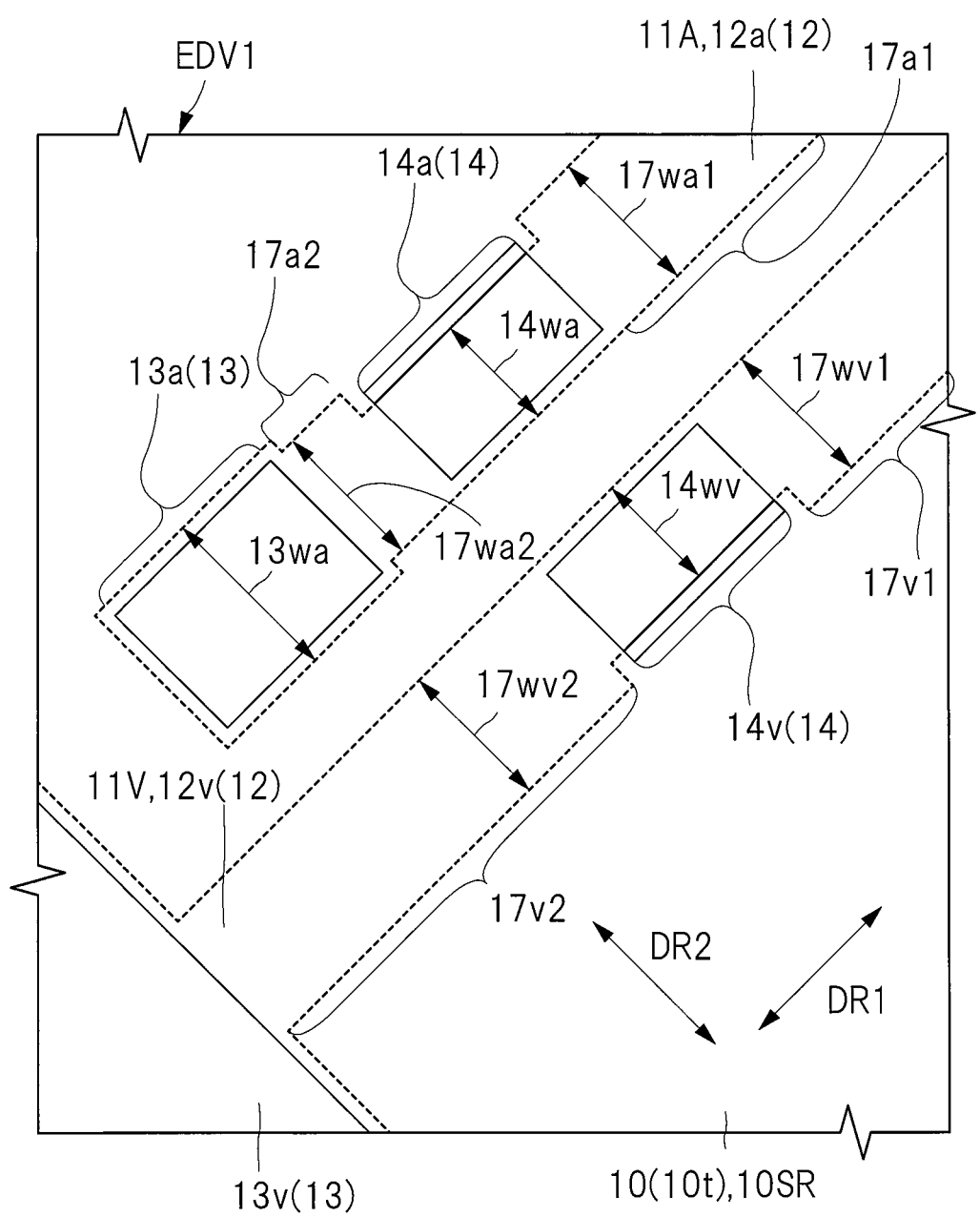
FIG. 10 is an enlarged plan view enlargedly showing a periphery of a connection for capacitor shown in FIG. 9.
Figure 23:
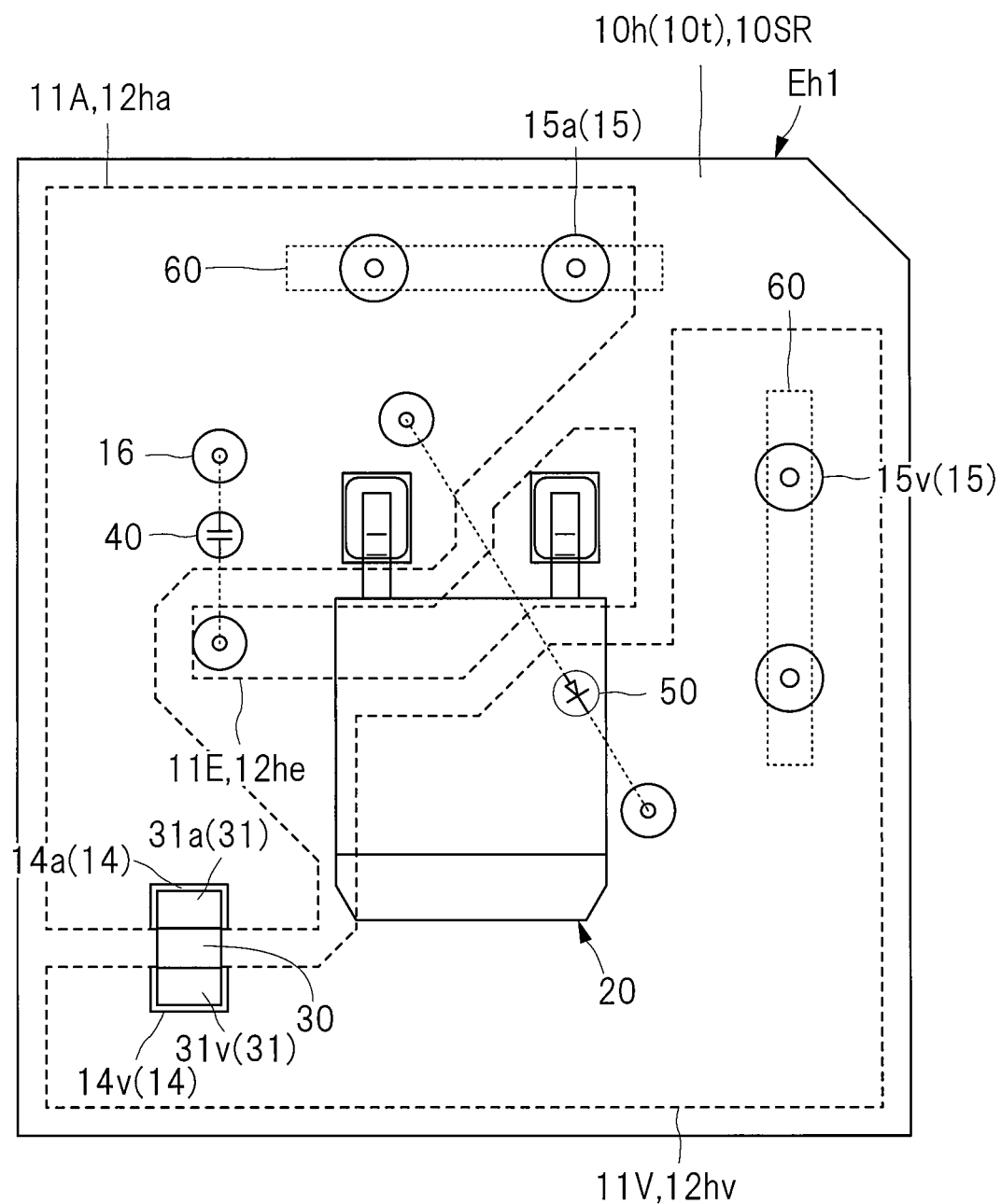
FIG. 23 is a plan view of an electronic device that is an examination example with respect to FIG. 3.
Figure 24:
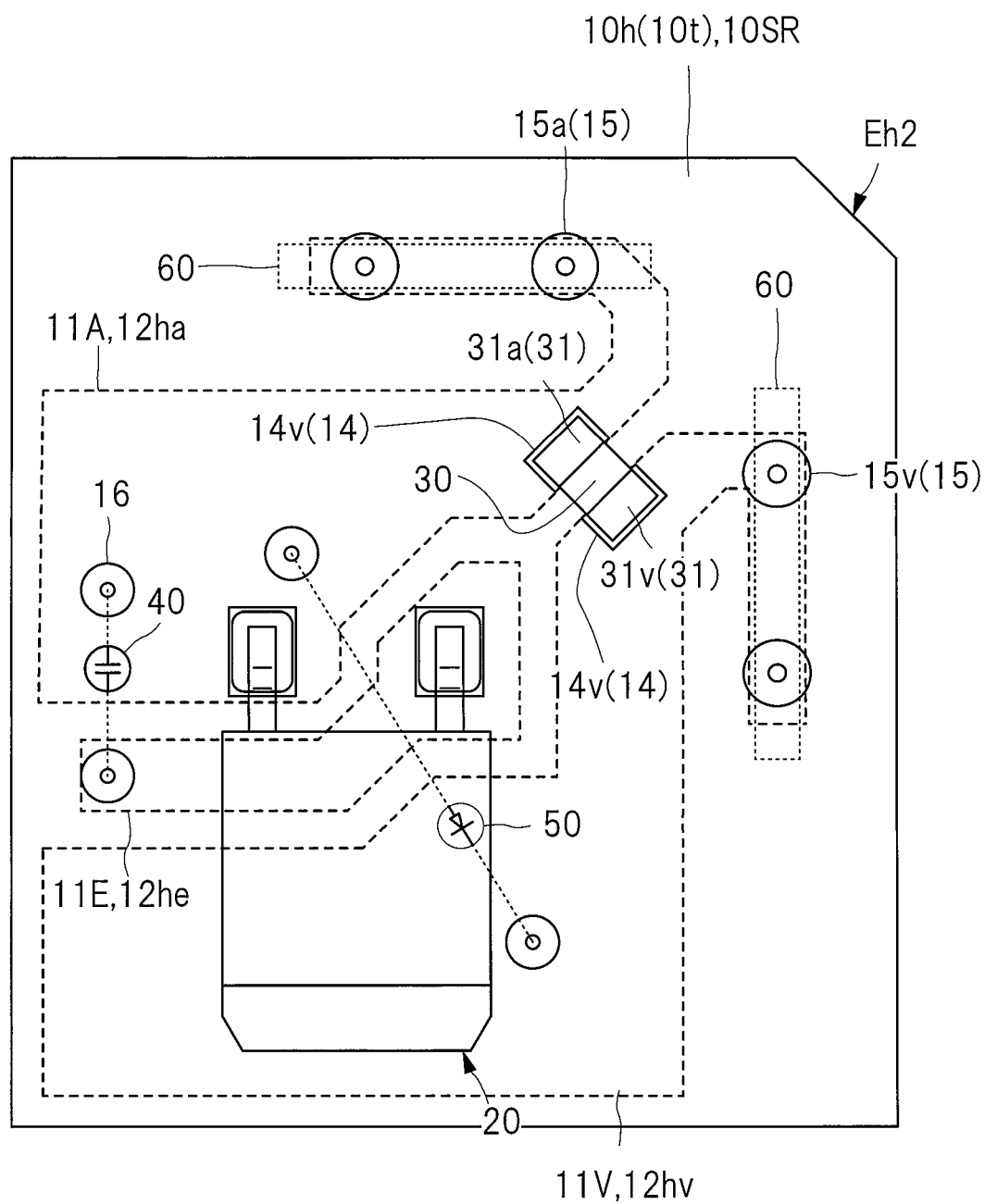
FIG. 24 is a plan view of an electronic device that is a modification example with respect to FIG. 23.

Next, detailed explanation will be made about a relation between noise influence on the semiconductor device that the electronic device has and layout on the wiring substrate with reference to an examination example with respect to the electronic device according to the present embodiment. FIG. 23 is a plan view of an electronic device that is an examination example with respect to FIG. 3. FIG. 24 is a plan view of an electronic device that is a modification example with respect to FIG. 23. FIG. 9 is a plan view of a wiring substrate from which the semiconductor and capacitor shown in FIG. 3 are removed. Additionally, FIG. 10 is an enlarged plan view enlargedly showing a periphery of a connection for capacitor shown in FIG. 9.

Incidentally, FIGS. 23 and 24 show, by dotted lines, outlines of conductor patterns 12ha, 12hv, and 12he and an external terminal 60. FIGS. 23 and 24 schematically show, by using circuit symbols, an example of the layout of the capacitor 40 and diode 50 arranged on a back surface of the wiring substrate 10. FIG. 9 schematically shows, by appending bidirectional arrows, wiring path distances 11a1, 11a2, and 11v1 and a wiring path distance 11v2. Wirings other than the wirings 12a and 12v among the plural wirings 12 are omitted from an illustration of FIG. 10.

In order to improve reliability of the electronic device on which the semiconductor device having a control circuit is mounted similarly to the present embodiment, it is necessary that operational reliability of the control circuit formed in the semiconductor device is improved. For this reason, the electronic device needs to have such a configuration as to improve noise resistance of the semiconductor device and that the control circuit operates stably.

Additionally, from the viewpoint of improving versatility of the electronic device, noise measures capable of suppressing transmission of noise is preferably taken in an relatively wide frequency band. In order to improve the noise resistance of the circuit, firstly, a method of connecting the bypass capacitor to the wiring path to be an object for the noise measures is effective in a frequency band, which has a large transmission quantity of noise, among frequency bands to be objects for improving the noise resistance, the bypass capacitor making an impedance value of the circuit reduce. Since the capacitor is connected between the two wiring paths to be objects for the noise measures, impedance of the circuit can be reduced in a frequency band depending on a value of capacitance of the capacitor.

For example, in the example shown by FIG. 3, the semiconductor device 20 is recited as a component having a great influence on the noise transmission of the circuit. In a frequency band close to an antiresonant frequency of the semiconductor device 20, the impedance value of the circuit rises sharply, and the noise is easily propagated (in other words, the noise resistance degrades). The antiresonant frequency means a value $f_0$ of a resonant frequency when a component (semiconductor device 20 in the above example)

is regarded as a parallel resonant circuit having a resistance component R, a capacity component C, and an inductance component L, the value $f_0$ being obtained from the equation $f_0=1/2\Pi(LC)^{1/2}$. In the parallel resonant circuit, flowing currents mutually cancel out in the resonant frequency, a current value becomes a minimum when a resonant circuit is viewed from outside, and so apparent impedance is maximized.

Therefore, if the bypass capacitor having an electrical characteristic of reducing impedance near an antiresonant frequency of the semiconductor device 20 is inserted between the power supply line 11V and the output line 11A shown in FIG. 8, a quantity of noise propagated via the power supply line 11V or output line 11A and caused by the semiconductor device 20 can be reduced. However, it has been understood from examination by the inventors of the present application that an effect of reducing the impedance in a predetermined frequency band is not obtained depending on the layout of the wiring(s) and the bypass capacitor. A result(s) of its examination will be detailed later.

Additionally, when the wire (s) is connected to the electronic device EDV1 as shown in FIG. 1, it is necessary to consider an influence of propagation to the semiconductor device 20 by the noise from a wire side (in other words, external terminal 60 side shown in FIG. 4). When the external terminal 60 (see FIG. 6) having a large surface area is mounted as shown in FIG. 6, it is necessary that the noise influence of the external terminal 60 itself is considered. Therefore, in order to improve the noise resistance of the circuit in the present embodiment, the impedance needs to be reduced in a frequency band close to the antiresonant frequency of the semiconductor device 20 and in a frequency band close to the antiresonant frequency of the external terminal 60 (a wire influence is also considered when the wire(s) are connected).

Therefore, the inventors of the present application has examined, as a noise-measures method in a state of having a plurality of main noise sources, a method of connecting to the circuit(s) a plurality of bypass capacitors having different frequent characteristics, and improving the noise resistance in a frequency band close to each of the antiresonant frequencies of the plural noise sources. In this case, if a difference between the antiresonant frequencies of the plural noise sources is large, a bypass capacitor corresponding to each of a plurality of kinds of antiresonant frequencies can be connected. When noise filtering is performed in a low frequency, an inductor for the noise filtering may be inserted into the circuit.

Incidentally, when the plural wirings are run in parallel so as to extend along each other similarly to the present embodiment, a capacity coupling occurs between the wirings adjacent to each other. Therefore, examined has been a technique of using, as a bypass capacitor, capacity caused between the paired wirings each running in parallel. However, for example, when the wiring having a wiring width of 0.2 mm and an inter-wiring distance of 0.1 mm is ignored about an influence(s) of wirings other than the two wirings each running in parallel, the capacitor becomes approximately a capacity value of 0.8 µF (picofarad) even if a parallel-running distance (a distance in which the two wirings extend along each other) is set at 30 mm. It is difficult to obtain, from such a capacity value, an effect of a bypass capacitor for noise filtering. Therefore, when the bypass capacitor for noise filtering is provided, a capacitor capable of obtaining a capacity value of 0.001 µF or more such as a ceramic capacitor or electrolytic capacitor is preferably used.

Additionally, if the number of electronic components for noise measures increases, a space for mounting the electronic components on the wiring substrate becomes necessary. Therefore, the inventors of the present application have examined a reduction in the number of noise suppression parts. From a result(s) of the examination, the followings have been understood: similarly to the electronic device EDV1 of the present embodiment shown in, for example, FIG. 3, by an impedance reduction effect of the capacitor 30 due to a contrivance of layout of the bypass capacitor (capacitor 30) and the wirings 12v and 12a on the wiring substrate 10, the propagation of noise caused by the semiconductor device 20 and the propagation of noise caused by the external terminal 60 (see FIG. 4) can be reduced.

Hereinafter, explanation will be made with reference to an electronic device Eh1 of the examination example shown in FIG. 23 and the electronic device EDV1 of the present embodiment shown in FIG. 3. Incidentally, the following explanation will be mainly made about the electronic device Eh1 based on a difference between it and the electronic device EDV1 shown in FIG. 3. Thus, the explanation of the electronic device Eh1 is almost the same as that of the electronic device EDV1 except for the following explanation.

The electronic device Eh1 shown in FIG. 23 is different from the electronic device EDV1 shown in FIG. 3 in pattern shapes of the power supply line 11V, the output line 11A, and the wiring path 11E, which are formed on the wiring substrate 10, and in a positional relation of the electronic components mounted on the wiring substrate 10h.

Each of the conductor pattern 12hv constituting the power supply line 11V and the conductor pattern 12ha constituting the output line 11A becomes a large area conductor pattern in the electronic device Eh1. Most (at least one half or more, two thirds or more in an example shown in FIG. 23) of the main surface 10t of the wiring substrate 10h is covered with the conductor pattern 12hv or conductor pattern 12ha.

Additionally, in a case of the electronic device ED1 shown in FIG. 3, the external terminal 30 (see FIG. 4), the capacitor 30, and the semiconductor device 20 are connected in order along each extension direction of the wirings 12v and 12a. Meanwhile, in a case of the electronic device Eh1 shown in FIG. 23, the connection order is not as clear as that of the electronic device EDV1. As placement of a component, however, the semiconductor device 20 is placed between the capacitor 30 and the external terminal 60. Incidentally, also in the case of the electronic device Eh1, a connection relation of the circuits can be represented similarly to the circuit diagram of the electronic device EDV1 shown in FIG. 8.

In the case of the electronic device Eh1, an increase in the areas of the conductor patterns 12hv and 12ha makes it possible to reduce resistance values of the power supply line 11V and output line 11A. However, from a result(s) of conducting a test(s) about the noise resistance, it has been understood that a false operation(s) of the control circuit occurs in a part of a frequency band.

A reason(s) for occurrence of the false operation by the control circuit in the above test is thought as follows. That is, when the capacitor 30 is not provided between the semiconductor device 20 and the external terminal 60 like the electronic device Eh1, noise is propagated without interposing the capacitor 30, and so the noise reduction effect by the capacitor 30 is not obtained.

Next, as shown in FIG. 24, a reduction effect of a noise propagation quantity is evaluated about an electronic device Eh2 in which the capacitor 30 is placed between the semiconductor device 20 and the external terminal 60. The electronic device Eh2 shown in FIG. 24 is different from the electronic device Eh1 shown in FIG. 23 in the placement of the capacitor 30 and in that the external terminal 60 is mounted on the wiring(s). The constitution of the electronic device Eh2 shown in FIG. 24 is almost the same as that of the electronic device Eh1 shown in FIG. 23 except for the above difference, and so repetitive explanation thereof will be omitted.

The reduction effect of the noise propagation quantity can be evaluated by using a correlation diagram between a frequency and impedance of a circuit besides the testing method explained with reference to FIG. 2. That is, if there is a frequency at which the impedance rises locally, its frequency band means that noise is easily propagated. Additionally, if a peak value of the impedance near the antiresonant frequency becomes small in the correlation diagram between the frequency and the impedance, it can be thought that the noise resistance is improved.

If the electronic device Eh2 shown in FIG. 24 is compared to the electronic device Eh1 shown in FIG. 23, it is understood on the correlation diagram between the frequency and the impedance that the peak value of the impedance can be reduced, but the reduction is slight. This is because the capacitor 30 is placed between the semiconductor device 20 and the external terminal 60, and thereby the quantity of noise propagated without interposing the capacitor can be reduced. Therefore, if the number of paths electrically connecting the external terminal 60 and the semiconductor device 20 decreases by circumventing the capacitor 30, the reduction effect of the impedance due to the capacitor 30 can be increased.

Additionally, from the examination of the inventors in the present application, it is understood that there is room for further improving noise resistance in the electronic device Eh2 shown in FIG. 24. The inventors in the present application pay attention to a phase difference between two wiring paths between which the bypass capacitor is inserted. For example, a path from the connection 15 connected to the external terminal 60 to the connection 14 connected to the capacitor 30 in the case of the electronic device Eh2 shown in FIG. 24 is shorter than each wiring path distance of the power supply line 11V and the output line 11A, and so occurrence of a phase difference between the external terminal 60 and the capacitor 30 can be suppressed. Meanwhile, each pattern width of the conductor patterns 12hv and 12ha is large between the capacitor 30 and the semiconductor device 20, and a transmission path does not stabilize, so that the phase difference between the power supply line 11V and the output line 11A is easy to generate. As a result, the noise due to the phase difference between the power supply line 11V and the output line 11A becomes easy to propagate to the semiconductor device 20, which brings a cause of degrading the noise resistance as the whole of the electronic device Eh2.

Meanwhile, in the electronic device EDV1 of the present embodiment as shown by FIG. 3, the wiring 12v constituting the power supply line 11V and the wiring 12a constituting the outline line 11A are arranged so as to extend along each other. Incidentally, as shown in FIG. 3, the wirings 12v and 12a extend in a different direction from each other at an overlapping portion with the connection 15 that is connected to the external terminal 60 (see FIG. 4). However, the wirings 12v and 12a extend along each other and between the connection 13 and the connection 14 that each connect the capacitor 30 and the semiconductor device 20. The wirings 12v and 12a extend along each other on most of the connections 14 and 15 that each connect the external terminal 60 and the capacitor 30. More specifically, the wirings 12v and 12a extend along each other in one half or more of the wiring paths of wirings 12v and 12a in a region between the connections 14 and 15 (the connection 15 whose wiring path distance is closest to the connection 14).

Thus, since the wirings 12v and 12a are arranged so as to extend along each other, occurrence of the phase difference between the power supply line 11V and the output line 11A can be suppressed. As a result, the noise resistance of the electronic device EDV1 can be improved.

Additionally, from the viewpoint of suppressing the propagation of noise to the semiconductor device 20, it is particularly important to suppress the occurrence of the phase difference between the capacitor 30 and the semiconductor device 20. Therefore, the wiring path distance between the capacitor 30 and the semiconductor device 20 is preferably made as short as possible. Meanwhile, if the wiring path distance between the capacitor 30 and the external terminal 60 (see FIG. 4) becomes long, there is a possibility that a phase difference between the capacitor 30 and the external terminal 60 will occur. However, even when the phase difference between the capacitor 30 and the external terminal 60 occurs, a noise component(s) is filtered by the capacitor 30 if the noise due to the phase difference extremely becomes no loud. Therefore, it can be suppressed that the noise due to the phase difference propagates the semiconductor device 20. That is, to shorten the wiring path distance between the capacitor 30 and the external terminal 60 is lower in priority than to shorten the wiring path distance between the capacitor 30 and the semiconductor device 20.

Additionally, although detailed later, the electronic device EDV1 of the present embodiment adjusts the wiring path distance between the capacitor 30 and the external terminal 60 so that a value of the antiresonant frequency on a semiconductor device 20 side and a value of the antiresonant frequency on an external terminal 60 side become close to each other, thereby reducing the impedance near both of the antiresonant frequencies by the one capacitor 30.

For this reason, in the present embodiment, the wiring path distance of the wiring path connecting the capacitor 30 and the semiconductor device 20 shown in FIG. 3 becomes shorter than the wiring path distance connecting the capacitor 30 and the external terminal 60. More specifically, a wiring path distance 11a1 between connections 13a and 14a in the wiring 12a shown in FIG. 9 is shorter than each of a wiring path distance 11a2 between connections 15a and 14a and a wiring path distance 11v2 between connections 15v and 14v. A wiring path distance 11v1 between the connections 13v and 14v in the wiring 12a shown in FIG. 9 is shorter than each of the wiring path distance 11v2 between the connections 15v and 14v and the wiring path distance 11a2 between the connection 15a in the wiring 12a and the connection 14a.

Incidentally, the wiring path distance between the respective connections as shown by FIG. 9 is defined as a path distance that connects respective centers of the connections. Additionally, when the connection 15a shown in FIG. 9 is plural in number, a path distance from the connection 15a, which has the closest wiring path distance to the connection 14a among the plural connections 15a, to the connection 14a is defined as a wiring path distance 11a2. Similarly thereto, when the connection 15v is plural in number, a path distance from the connection 15v, which has the closest wiring path distance to the connection 14v among the plural connections 15v, to the connection 14v is defined as a wiring path distance 11v2.

Like the present embodiment, if the wiring path distance of the wiring 12 connecting the capacitor 30 and semiconductor device 20 shown in FIG. 3 is made short, the occurrence of the phase difference between the wirings 12a and 12v can be suppressed between the capacitor 30 and the semiconductor device 20. For example, from the viewpoint of hardly generating the phase difference, since the impedance on a wiring path preferably agrees with the impedance on another wiring path, the wiring path distances 11a1 and 11v1 shown in FIG. 9 becomes more preferably equal. However, positions and shapes of the connections 13a and 13v are determined correspondingly to each structure of terminals 22 (see FIGS. 3 and 5) of the semiconductor device 20 (see FIG. 3). For this reason, the wiring path distances 11a1 and 11v1 as shown by FIG. 9 are often unequal. However, each of the wiring path distances 11a1 and 11v1 in the present embodiment is short, so that the large phase difference hardly occurs. Therefore, the present embodiment can suppress degradation of the noise resistance due to the phase difference generated on the wiring path that connects the capacitor 30 and the semiconductor device 20 shown in FIG. 3.

Additionally, the inventors of the present application have understood from their examination result(s) that: the wiring path distances 11a1 and 11v1 shown FIG. 9 are fixed; the lengths of the wiring path distances 11a2 and 11v2 are adjusted so as to make the antiresonant frequencies on the semiconductor device 20 side shown in FIG. 3 and on the external terminal 60 side shown in FIG. 4 close to each other; and thereby the number of capacitors for noise measures is reduced.

As described above, when components each having a great noise influence exist on the semiconductor device 20 side and the external terminal 60 side, the noise measures needs to be taken with respect to each of the plural antiresonant frequencies. If values of the plural antiresonant frequencies become close to each other, an impedance value of the circuit further rises close to the antiresonant frequency by influences from each other. For this reason, in order to improve the noise resistance of the circuit in which the plural antiresonant frequencies exist, thought is a method of connecting a bypass capacitor having an impedance reduction characteristic (in other words, capacity value) corresponding to each of the plural antiresonant frequencies so as to make values of the plural antiresonant frequencies separate from each other.

However, the inventors of the present application has understood from their examination that if the number of paths electrically connecting the external terminal 60 and the semiconductor device 20 by circumventing the capacitor 30 is made few even when the values of the plural antiresonant frequencies are close to each other, the impedance can be reduced by the capacitor 30. That is, the electronic device EDV1 of the present embodiment suppresses, in one capacitor 30, an increase in impedance relative to the antiresonant frequency on the semiconductor device 20 side, and an increase in impedance relative to the antiresonant frequency on the external terminal 60 side. For example, the antiresonant frequency on the semiconductor device 20 side shown by FIG. 3 in the present embodiment is about 265 MHz (megahertz). At this time, when lengths of the wiring path distances 11a2 and 11v2 shown by FIG. 9 are adjusted, inductances of wirings 12a and 12v vary, so that the value of the antiresonant frequency on the external terminal 60 side can be adjusted.

Thus, if the number of electronic components (capacitors 30) for noise measures can be reduced, amounting area of the electronic component can be lessened, so that a planar size of the wiring substrate 10 can be reduced. Or, since a degree of freedom of layout about the plural wirings 12 that the wiring substrate 10 has is increased, a relation between the wiring path distances 11a1, 11a2, 11v1, and 11v2 is easily adjusted. In other words, the values of the plural antiresonant frequencies are easily adjusted. Additionally, since the number of electronic components is decreased, the electronic device EDV1 is easily assembled, and so a manufacturing efficiency is improved. Further, since the number of electronic components is decreased, a decrease in reliability of the circuit due to failures of some of the components can be prevented.

Additionally, a width of the connection 14 connected to the electrode 31 of the capacitor 30 among the wirings 12 show by FIG. 3 in the present embodiment becomes narrower than a width of an extension portion of the wiring 12. More specifically, this can be expressed as follows.

As shown in FIG. 10, the wiring 12a constituting the output line 11A is placed between the connections 14a and 15a (see FIG. 9), and has an extension portion 17a1 extending along a direction DR1. Additionally, the wiring 12v constituting the power supply line 11V is placed between the connections 14v and 15v (see FIG. 9), and has an extension portion 17v1 extending along the direction DR1. Here, a width 14wa of the connection 14 in a direction DR2 orthogonal to the direction DR1 is narrower than a width 17wa1 of the extension portion 17a1 in the direction DR2. Further, a width 14wv of the connection 14v in the direction DR1 is narrower than a width 17wv1 of the extension portion 17v1 in the direction DR2.

From the viewpoint of reducing the impedance of the power supply line 11V and the output line 11A, a width of the wiring 12v or 12a may be large in some degree. Additionally, considering working accuracy of the wiring patterns, the patterns made wide in some degree are easily patterned. Meanwhile, from the viewpoint of reducing a quantity of noise propagated without interposing the capacitor 30 shown in FIG. 3 (in other words, without being filtered by the capacitor 30), a path(s) circumventing a connection portion of the capacitor 30 and the wiring 12 preferably becomes as few as possible.

Therefore, the present embodiment reduces a path(s) circumventing the connection portion of the capacitor 30 (see FIG. 3) and the wiring 12 by locally narrowing each of the width 14wa of the connection 14a and the width 14wv of the connection 14v as shown in FIG. 10. Additionally, since a width 17wa1 of the extension portion 17a1 having a long wiring path distance in the wiring 12a is made large, the impedance of the output line 11A can be reduced. Similarly, since a width 17wv1 of the extension portion 17v1 having a long wiring path distance is made large, the impedance of the power supply line 11V can be reduced.

Additionally, in an example shown by FIG. 10, a width of the connection 14 is narrower than a width of an extension portion between the connections 14 and 13. More specifically, as shown in FIG. 10, the wiring 12a constituting the output line 11A is placed between the connections 14a and 13a, and has an extension portion 17a2 extending along the direction DR1. Further, the wiring 12v constituting the power supply line 11V is placed between the connections 14v and 13v, and has an extension portion 17v2 extending along the direction DR1. Here, a width 14*wa* of the connection 14*a* in the direction DR2 is narrower than a width 17*wa*2 of the extension portion 17*a*2 in the direction DR2. Furthermore, a width 14*wv* of the connection 14*v* in the direction DR1 is narrower than a width 17*wv*2 of the extension portion 17*v*2 in the direction DR2.

Thus, since the width 17*wa*2 of the extension portion 17*a*2 is larger than the width 14*wa* of the connection 14*a* and the width 17*wv*2 of the extension portion 17*v*2 is larger than the width 14*wv* of the connection 14*v*, the impedance of the wiring path that connects the semiconductor device 20 and the capacitor 30 shown by FIG. 3 can be reduced.

Additionally, in the present embodiment, the width 14*wa* of the connection 14*a* of the wiring 12*a* is narrower than the width 17*wv*1 of the extension portion 17*v*1 of the wiring 12*v* and the width 17*wv*2 of the extension portion 17*v*2. Further, the width 14*wv* of the connection 14*v* of the wiring 12*v* is narrower than the width 17*wa*1 of the extension portion 17*a*1 of the wiring 12*a* and the width 17*wa*2 of the extension portion 17*a*2.

Additionally, as shown in FIG. 10, the width 14*wa* of the connection 14*a* of the wiring 12*a* is narrower than the width 13*wa* of the connection 13*a* in the direction DR2, the connection 13*a* being connected to the terminal 22*a* (see FIG. 3) of the semiconductor device 20 (see FIG. 3). If the width 14*wa* of the connection 14*a* is fully narrow, the wiring path in which a noise component(s) circumvents the capacitor 30 (see FIG. 3) does not occur even when the width 13*wa* of the connection 13*a* is made large. Further, by making the width 13*wa* of the connection 13*a* large, mounting reliability of the terminals 22*a* shown by FIG. 3 can be improved. Similarly, the width 14*wv* of the connection 14*v* of the wiring 12*v* is narrower than the width 13*wv* of the connection 13*v* in the direction DR2, the connection 13*v* being connected to the terminal 22*v* (see FIG. 5) of the semiconductor device 20 (see FIG. 5). The connection 13*v* functions as a fixing portion for fixing the semiconductor device in addition to functioning as a path for supplying a power supply potential to the semiconductor device 20 shown by FIG. 5. Therefore, by making the width 13*wv* of the connection 13*v* large, an area of the connection 13*v* increases, and so the mounting reliability of the semiconductor device 20 is improved.

Incidentally, although omitted in the figures, a modification example with the respect to the present embodiment may have a structure of making the width 14*wa* shown in FIG. 10 the same as the width 17*wa*1 or 17*wa*2 or larger than the width 17*wa*1 or 17*wa*2. Additionally, the width 14*wv* shown in FIG. 10 may be made the same as the width 17*wv*1 or 17*wv*2 or larger than the width 17*wv*1 or 17*wv*2. For example, even if the width 14*wa* and 14*wv* are made as narrow as possible depending on a size of an mounting surface of the electrode 31 of the capacitor 30 shown by FIG. 3, it is thought that the width 14*wa* and 14*wv* may become nearly equal to the width 17*wa*1, 17*wa*2, 17*wv*1, or 17*wv*2 in same cases.

Figure 11:
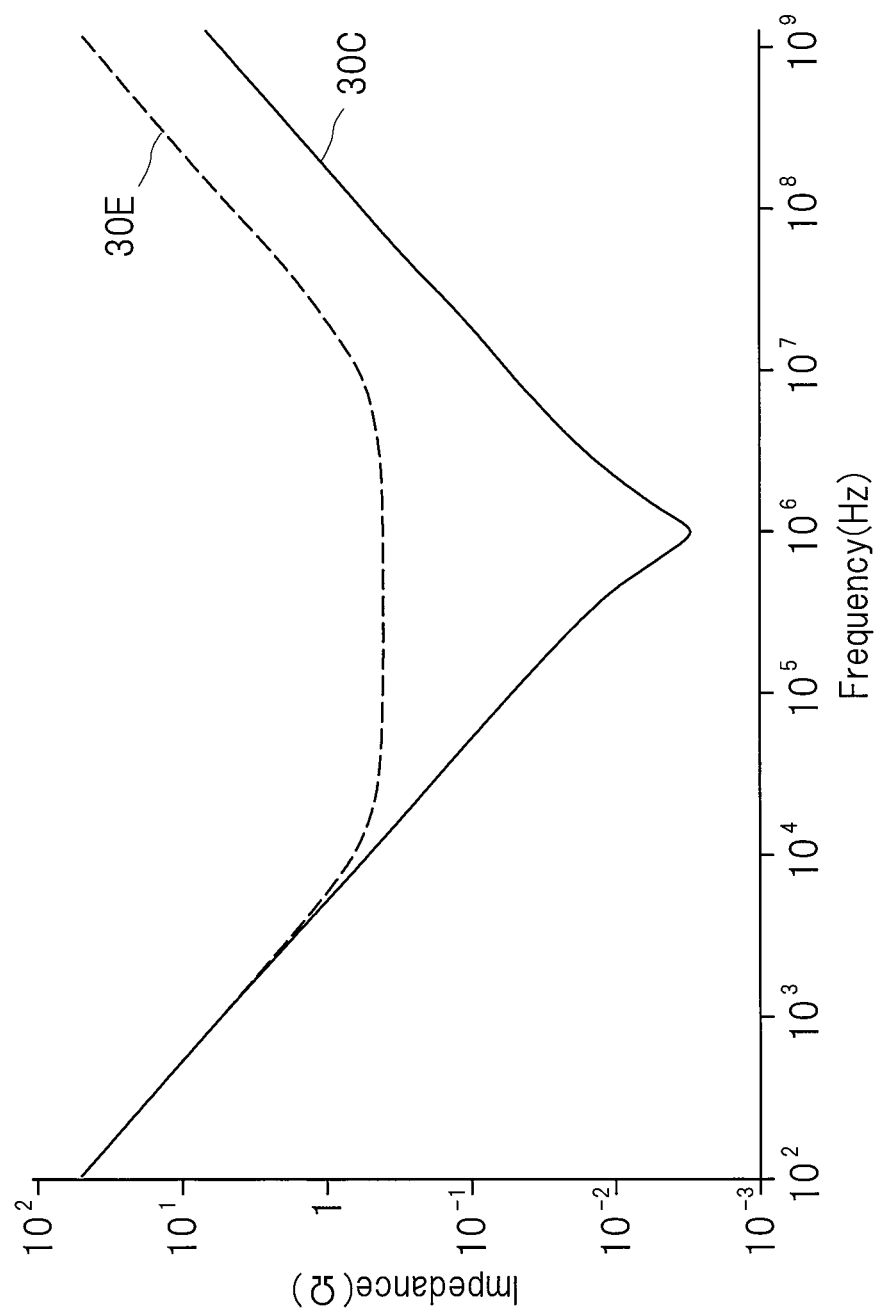
FIG. 11 is an explanatory diagram showing characteristic curves relative to a frequency and impedance about each of a ceramic capacitor and an aluminum electrolytic capacitor.
Figure 12:
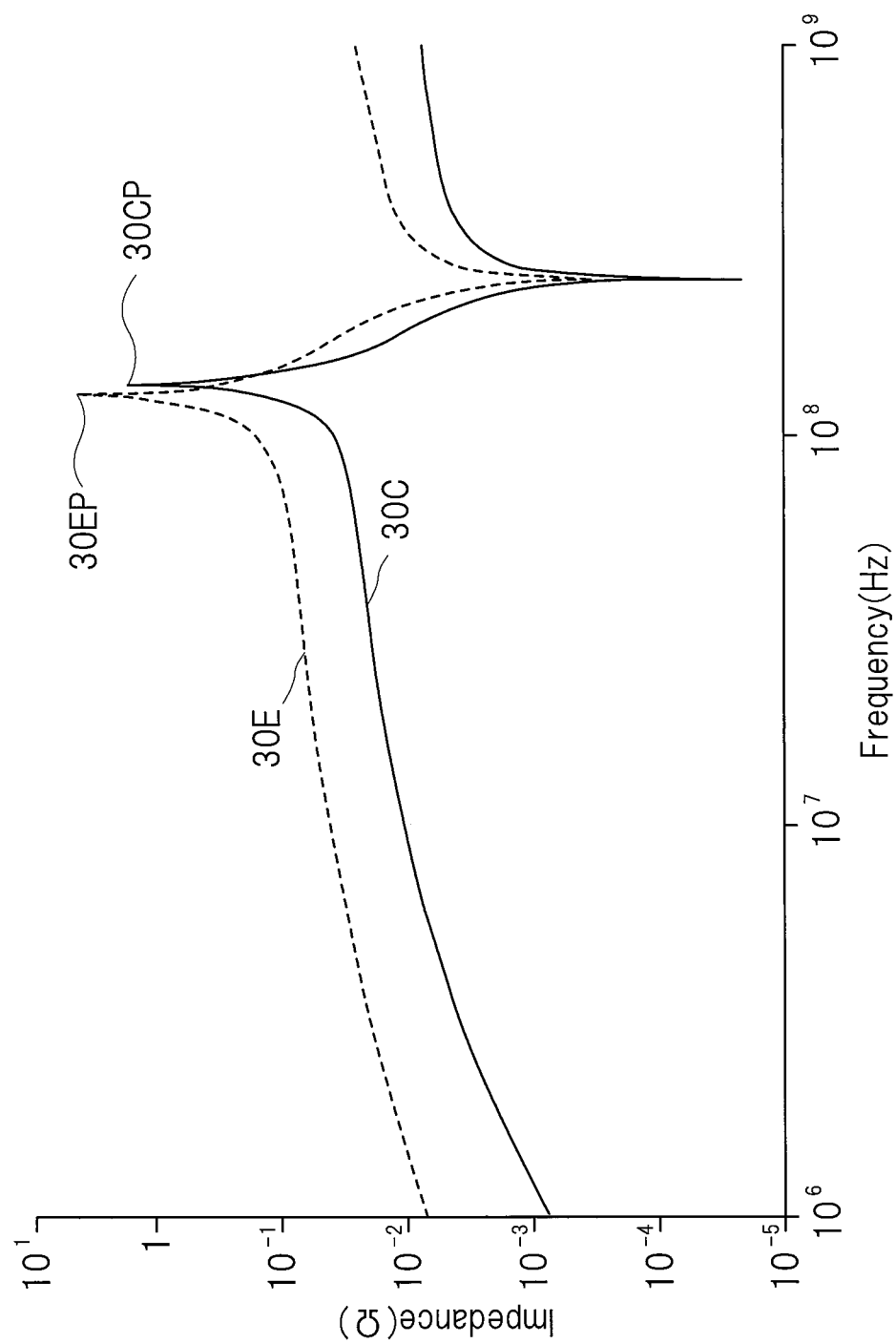
FIG. 12 is an explanatory diagram comparing, in the electronic device shown in FIG. 3, a characteristic curve when an electrolytic capacitor is used as a capacitor for noise measures and a characteristic curve when a ceramic capacitor is used.
Figure 25:
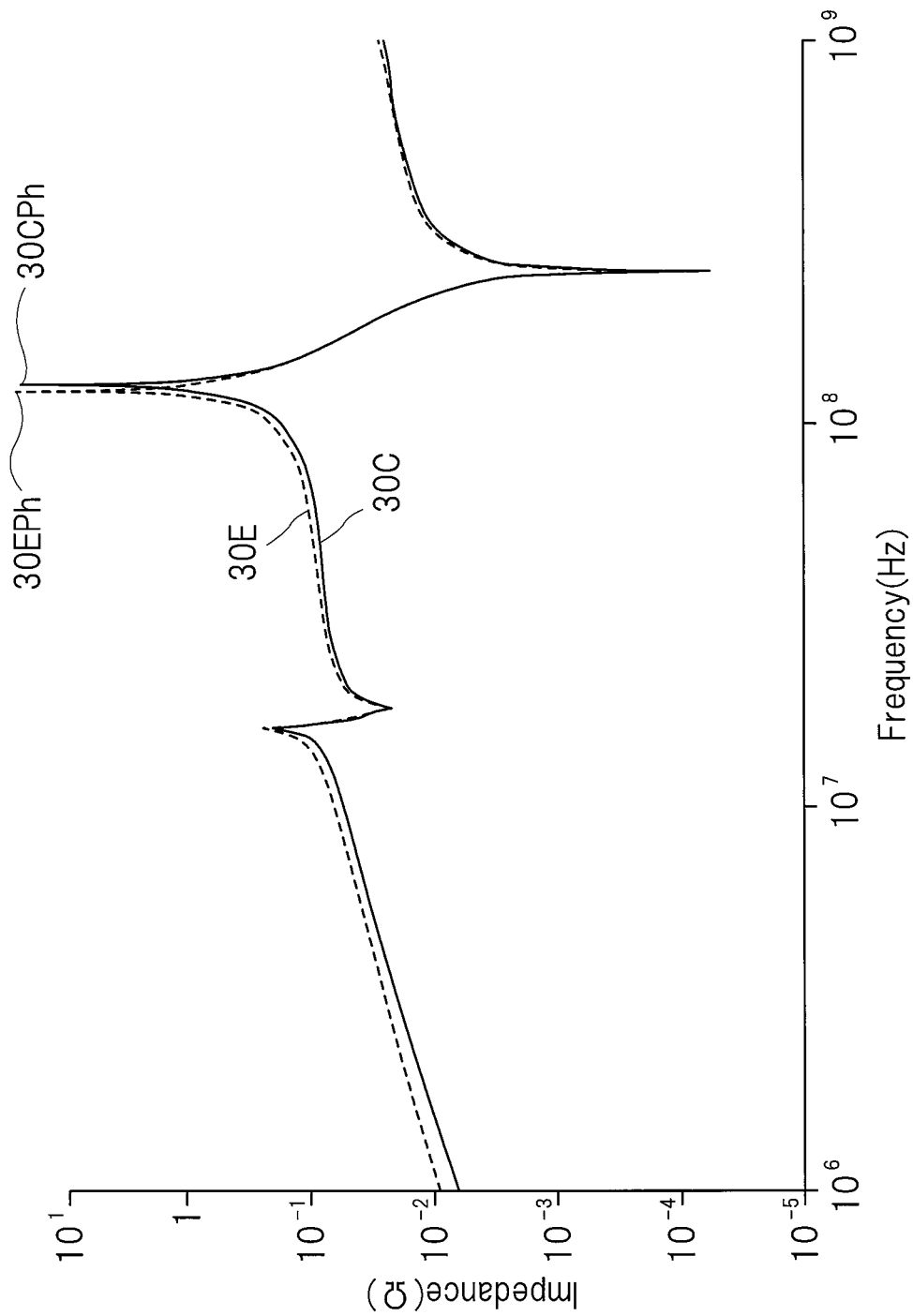
FIG. 25 is an explanatory diagram comparing, in the electronic device shown in FIG. 23, a characteristic curve when an electrolytic capacitor is used as a capacitor for noise measures and a characteristic curve when a ceramic capacitor is used.

Next, an effect of improving the noise resistance will be explained with reference to a correlation between a frequency and impedance. FIG. 11 is an explanatory diagram showing characteristic curves relative to a frequency and impedance about each of a ceramic capacitor and an aluminum electrolytic capacitor. FIG. 12 is an explanatory diagram comparing, in the electronic device shown in FIG. 3, a characteristic curve when an electrolytic capacitor is used as a capacitor for noise measures and a characteristic curve when ceramic capacitor is used. FIG. 25 is an explanatory diagram comparing, in the electronic device shown in FIG. 23, a characteristic curve when an electrolytic capacitor is used as a capacitor for noise measures and a characteristic curve when a ceramic capacitor is used.

Incidentally, each of FIGS. 11, 12, and 25 is a double logarithm chart in which a frequency and impedance are indicated as vertical and horizontal lines on logarithm scales, respectively. Additionally, as an example of FIG. 11, a characteristic curve 30C about a ceramic capacitor having a capacity of 33 µF is indicated by a solid line, and a characteristic curve 30E about an electrolytic capacitor having a capacity of 33 µF (microfarad) is indicated by a dotted line. Similarly, as a bypass capacitor even in FIGS. 12 and 25, a characteristic curve obtained by using a ceramic capacitor is indicated by a solid line, and a characteristic curve obtained by using an electrolytic capacitor is indicated by a dotted line.

As shown in FIG. 3, the present embodiment uses a ceramic capacitor as a bypass capacitor for noise measures. In a case of the ceramic capacitor, for example, a vale of equivalent series resistance (ESR) or parasitic inductance (ESL) can be made small in comparison with an electrolytic capacitor having the same capacity. For this reason, the ceramic capacitor has a higher impedance reduction effect particularly in a high frequency region. In the example shown by FIG. 11, the characteristic curve 30C becomes smaller than the characteristic curve 30E in a frequency band of, for example, about 10 kHz (kilohertz) or more. That is, it is understood that the ceramic capacitor is more easily reduced about the noise resistance than the electrolytic capacitor in a frequency band higher than 10 kHz.

Incidentally, the example shown by FIG. 11 shows, as an example, the characteristic curve of the capacitor having a capacity of 33 µF. However, if the capacity values are equal, a relation between the characteristic curves of the ceramic capacitor and the electrolytic capacitor is almost the same as the example shown by FIG. 11 even when the values are different from the above capacity value. That is, the ceramic capacitor is more easily reduced about the noise resistance than the electrolytic capacitor in such a frequency band as to exceed 10 kHz.

Additionally, as shown in FIG. 25, when the bypass capacitor for noise measures is connected at a position of the capacitor 30 that the electronic device Eh1 shown in FIG. 23 has, no significant difference occurs between the impedance reduction effects by the ceramic capacitor and the electrolytic capacitor. Meanwhile, as shown in FIG. 12, when the bypass capacitor for noise measures is connected at a position of the capacitor 30 that the electronic device EDV1 shown in FIG. 3 has, the ceramic capacitor can be more drastically reduced about the impedance than the electrolytic capacitor. For example, in an example shown in FIG. 12, a peak 30CP of the impedance value on the characteristic curve 30C becomes one half or less with respect to a peak 30EP of the impedance value on the characteristic curve 30E. Further, the characteristic curve 30C is reduced about the impedance value in comparison with the characteristic curve 30EP even in a frequency band other than the peak 30CP.

From the comparison of FIGS. 25 and 12, when the capacitor 30 (see FIG. 3) having a structure for easily filtering noise is connected like the present embodiment, it is understood that use of the ceramic capacitor is particularly effective.

Additionally, the impedance at the peak 30CP shown by FIG. 12 becomes one tenth or less (e.g., the peak 30CP is about 7% of the peak 30CPh) of that at a peak 30CPh or 30EPh shown by FIG. 25. Further, the impedance at the peak 30EP shown by FIG. 12 becomes one fifth or less (e.g., the peak 30EP is about 17% of the peak 30CPh) of that at the peak 30CPh or 30EPh shown by FIG. 25. Thus, the present embodiment can reduce the impedance value that becomes a peak near the antiresonant frequency, and so can improve the noise resistance of the electronic device.

(Modification Example)

In the foregoing, the invention made by the inventors of the present invention has been concretely described based on the embodiments. However, it is needless to say that the present invention is not limited to the foregoing embodiments and various modifications and alterations can be made within a range not departing from the gist of the present invention.

Figure 13:
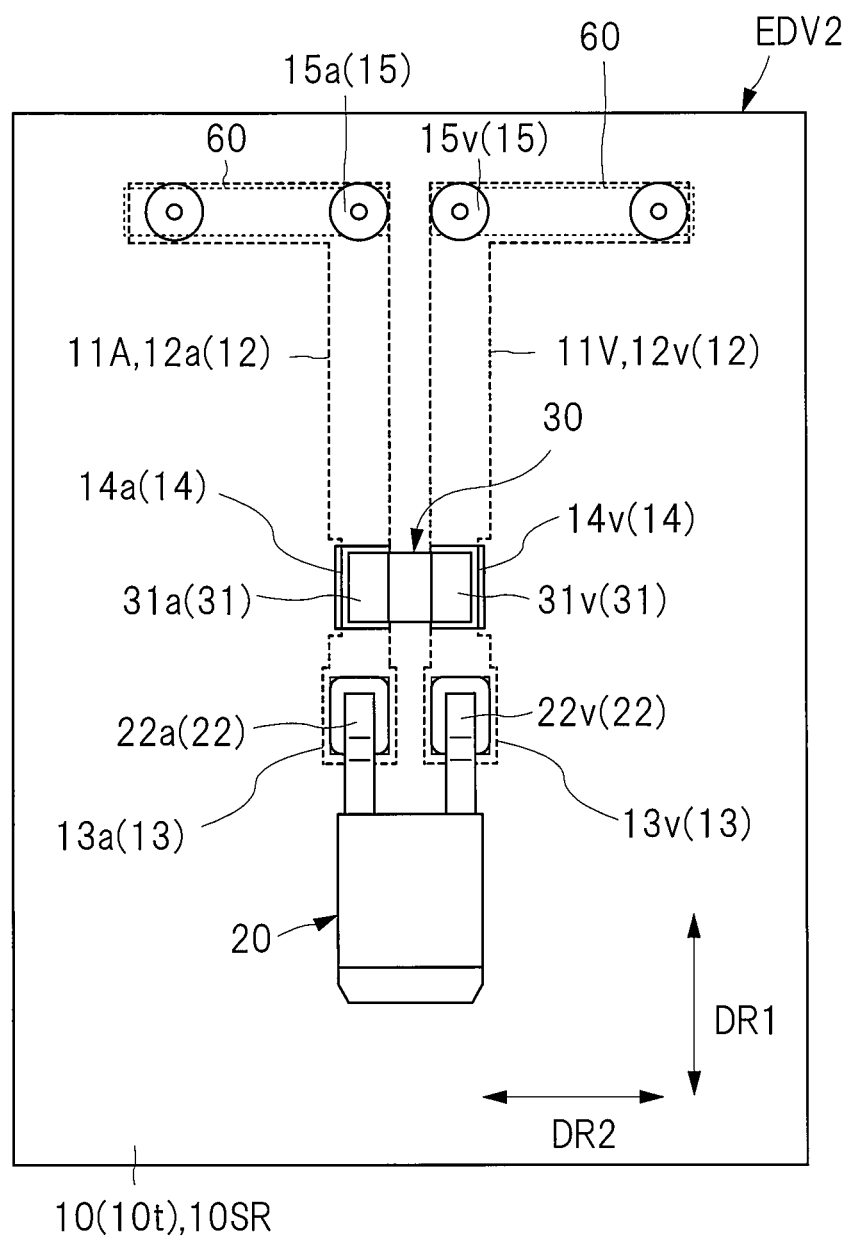
FIG. 13 is a plan view showing an electronic device as a modification example with respect to FIG. 3.

For example, in the electronic device EDV1 explained in the above embodiment, the capacitor 40 and the diode 50 constituting the resonator circuit are connected to the output line 11A as shown in FIG. 8. However, the capacitor 40 and diode 50 may be not connected depending on formation of a circuit (s). FIG. 13 is a plan view showing an electronic device as a modification example with respect to FIG. 3.

An electronic device EDV2 shown by FIG. 13 is different from the electronic device EDV1 shown by FIGS. 3 to 8 in that other electronic components are not connected between the connection 15 for the external terminal 60 and the connection 14 for the capacitor 30 and between the connection 14 for the capacitor 30 and the connection 13 for the semiconductor device 20.

More specifically, other electronic components (electronic components other than the external terminal 60 and the capacitor 30) are not connected between the connections 15a and 14a of the wiring 12a constituting the output line 11A that the electronic device EDV2 has. Additionally, other electronic components (electronic components other than the external terminal 60 and the capacitor 30) is not connected between the connections 15v and 14v of the wiring 12v constituting the power supply line 11V that the electronic device EDV2 has. Therefore, the occurrence of the phase differences due the other electronic components can be suppressed between the output line 11A and the power supply line 11V on the wiring path between the external terminal 60 and the capacitor 30 as a bypass capacitor.

Additionally, other electronic components (electronic components other than the semiconductor device 20 and the capacitor 30) are not connected between the connections 13a and 14a of the wiring 12a constituting the output line 11A that the electronic device EDV2 has. Further, other electronic components (electronic components other than the semiconductor device 20 and the capacitor 30) are not connected between the connections 13v and 14v of the wiring 12v constituting the power supply line 11V that the electronic device EDV2 has. Therefore, the occurrence of the phase differences due to the other electronic components can be suppressed between the output line 11A and the power supply line 11V on the wiring path between the semiconductor device 20 and the capacitor 30 as a bypass capacitor.

Figure 14:
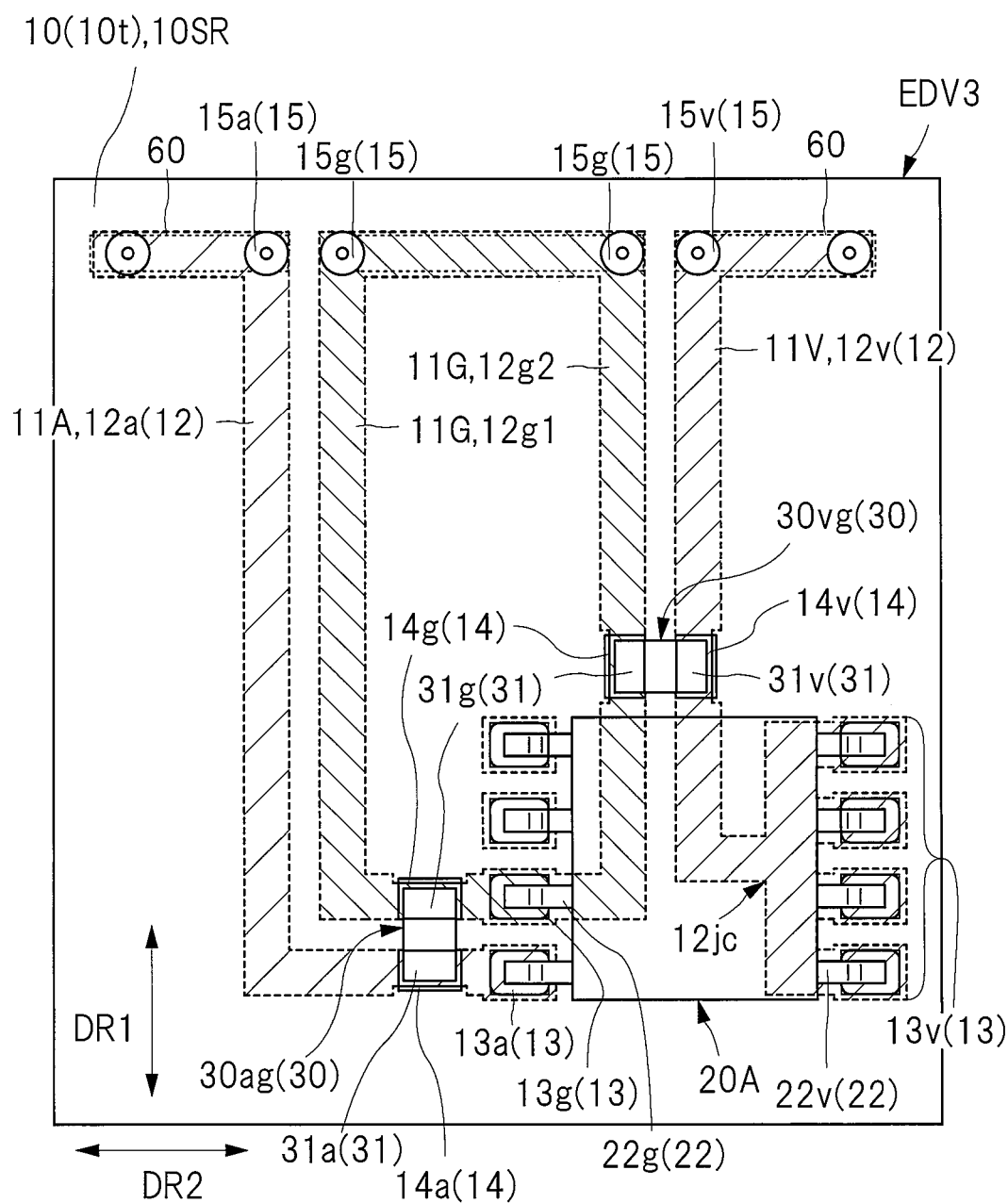
FIG. 14 is a plan view showing an electronic device as another modification example with respect to FIG. 3.

Additionally, explained in the example of the electronic device EDV1 shown by FIG. 3 has been the present embodiment in which the capacitor 30 is mounted across the output line 11A and the power supply line 11V. However, there are various modification examples about an example of the two wiring paths on which the bypass capacitor is mounted. FIG. 14 is a plan view showing an electronic device as another modification example with respect to FIG. 3. Incidentally, FIG. 14 is a plan view, but is shown by hatching each path wiring in order to make a distinction among the power supply line 11V, output line 11A, and reference potential line (wiring path or input line) 11G easily seen.

A semiconductor device 20A which an electronic device EDV3 shown by FIG. 14 has is different, in the number and layout of the terminals 22, from the semiconductor device 20 which the electronic device EDV1 shown by FIG. 3 has. The semiconductor device 20A has a plurality of terminals 22v for supplying a power supply potential(s). Further, the semiconductor device 20A has a so-called small outline package (SOP) structure in which the plural terminals 22v protrude from one side surface of a sealing body, and other plural terminals 22 protrude from an opposite side surface of the sealing body. The electronic device EDV3 shown by FIG. 14 is different from the electronic device EDV1 shown by FIG. 3 in that it has a reference potential line 11G for supplying a reference potential GND (see FIG. 1) to the semiconductor device 20A in addition to the power supply line 11V and the output line 11A. In the electronic device EDV1, the capacitors 30 are respectively connected between the output line 11A and the reference potential line 11G and between the power supply line 11V and the reference potential line 11G. More specifically, the capacitor 30a is mounted across the wirings 12a and 12g1, and the capacitor 30vg is mounted across the wirings 12v and 12g2.

In an example shown by FIG. 14, the reference potential line 11G has a wiring 12g1 extending along the wiring 12a, and a wiring 12g2 extending along the wiring 21v. The wirings 12g1 and 12g2 are electrically connected the wirings 12g1 and 12 in the example shown in FIG. 14. However, as a modification example, the wirings 12g1 and 12g2 may be connected to the external terminal 60 and the semiconductor device 20 independently from each other.

Additionally, each of the wirings 12g1 and 12g2 has: a connection 13g to which a terminal 22g of the semiconductor device 20 is connected; a connection 14g to which an electrode 31g of the capacitor 30 is connected; a connection 15g to which the external terminal 60 is connected. In other words, the connections 13g, 14g, and 15g are electrically connected to each other via the wirings 12g1 and 12g2.

In a case of the electronic device EDV3, the wiring 12a constituting the output line 11A and the wiring 12g1 constituting the reference potential line 11G are arranged so as to extend along each other. Further, the wiring 12v constituting the power supply line 11V and the wiring 12g2 constituting the reference potential line 11G are arranged so as to extend along each other. Then, each of paired wiring paths composed of the output line 11A and the reference potential line 11G and paired wiring paths composed of the power supply line 11V and the reference potential line 11G takes almost the same noise measures as paired wiring paths composed of the output line 11A and the power supply line 11V that have been explained with reference to the electronic device EDV1 shown in FIG. 3.

That is, the wiring 12a has, between the connections 15a and 13a, the connection 14a to which the capacitor 30ag is connected. The wiring 12g1 has, between the connections 15g and 13g, the connection 14g to which the capacitor 30ag is connected. A wiring path distance between the connections 13a and 14a in the wiring 12a is shorter than a wiring path distance between the connections 14a and 15a and a wiring path distance between the connections 14g and 15g. A wiring path distance between the connections 13g and 14g in the wiring 12g1 is shorter than the wiring path distance between the connections 14a and 15a and the wiring path distance between the connections 14g and 15g.

Therefore, the paired wiring paths composed of the output line 11A and the reference potential line 11G can improve the noise resistance similarly to the paired wiring paths composed of the output line 11A and the supply line 11V that have been explained with reference to the electronic device EDV1 shown in FIG. 3.

Additionally, as shown in FIG. 14, the wiring 12v has, between the connections 15v and 13v, the connection 14v to which the capacitor 30vg is connected. The wiring 12g2 has, between the connections 15g and 13g, the connection 14g to which the capacitor 30vg is connected. A wiring path distance between the connections 13v and 14v in the wiring 12v is shorter than a wiring path distance between the connections 14v and 15v and a wiring path distance between the connections 14g and 15g. A wiring path distance between the connections 13g and 14g in the wiring 12g2 is shorter than the wiring path distance between the connections 14v and 15v and the wiring path distance between the connections 14g and 15g.

Therefore, the paired wiring paths composed of the power supply line 11V and the reference potential line 11G can improve the noise resistance similarly to the paired wiring paths composed of the output line 11A and the power supply line 11V that have been explained with reference to the electronic device EDV1 shown in FIG. 3.

Additionally, as shown in FIG. 14, the semiconductor device 20 may have a plurality of terminals 22v for power supply potential. In an example shown by FIG. 14, the wiring 12v has a plurality of connections 13v at a tip portion to be connected to the semiconductor device 20. In the example shown by FIG. 14, the wiring 12v has a branch portion 12jc between the plural connections 13v and the one connection 14v. When the wiring 12 is branched on the way similarly to the wiring 12v, respective wiring path distances from the connection 14v to the plural connections 13v preferably have values as close as possible to each other. Therefore, as shown in FIG. 14, when the plural connections 13v are arranged along the direction DR1, the branch portion is preferably placed between the plural connections 13v in the direction DR1.

However, a wiring path distance between the connection 14, to which the capacitor 30 is connected, and the connection 13, to which the semiconductor device 20 is connected, is made short in the electronic device EDV3 similarly to the electronic device EDV1 shown in FIG. 3 and described above. For this reason, the electronic device EDV3 has a structure in which a phase difference hardly occurs between the connections 13 and 14 even if a wiring path difference between the wiring path distances to be paired occurs.

Figure 15:
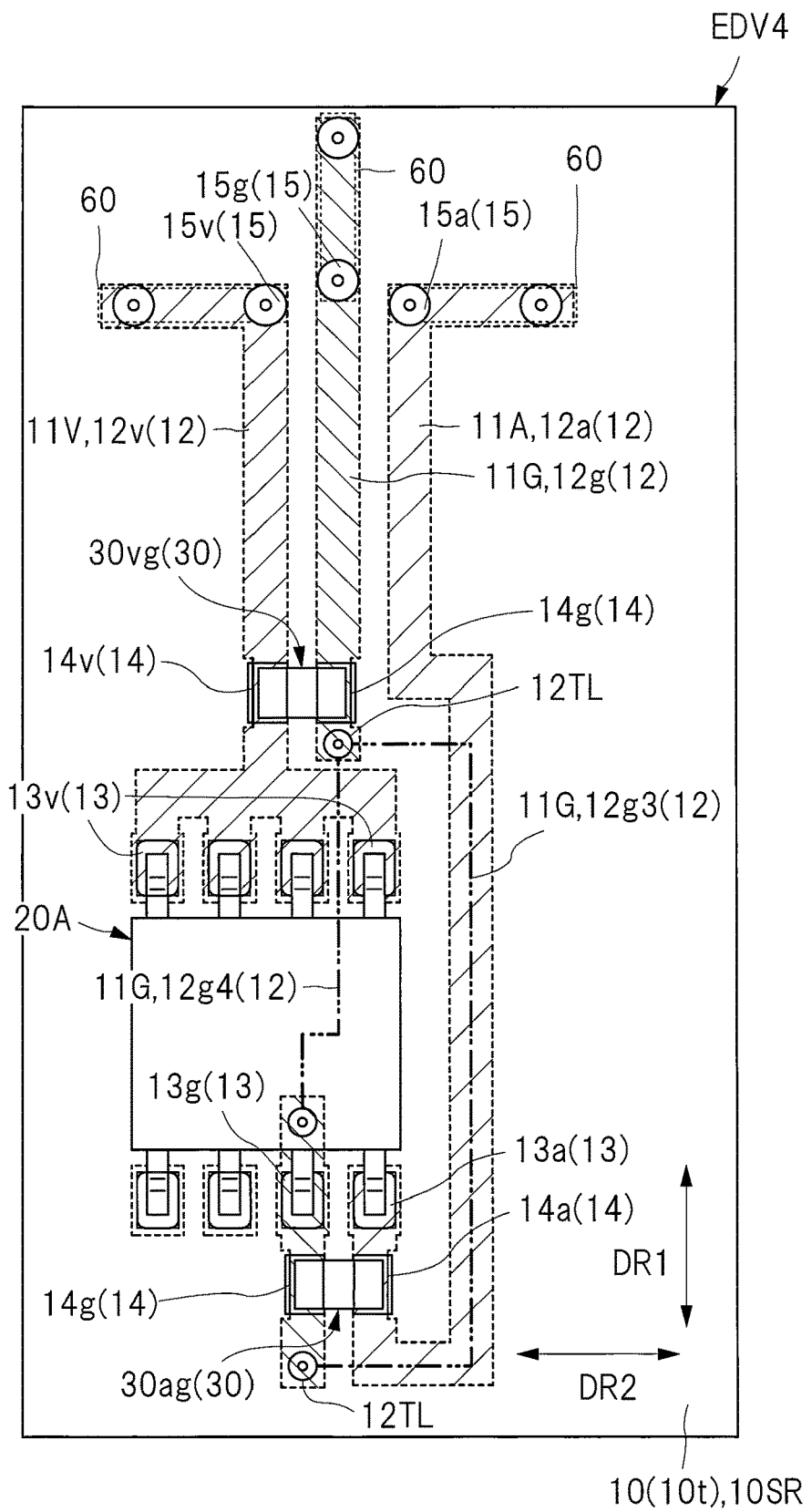
FIG. 15 is a plan view showing a modification example of the electronic device shown in FIG. 14.
Figure 16:
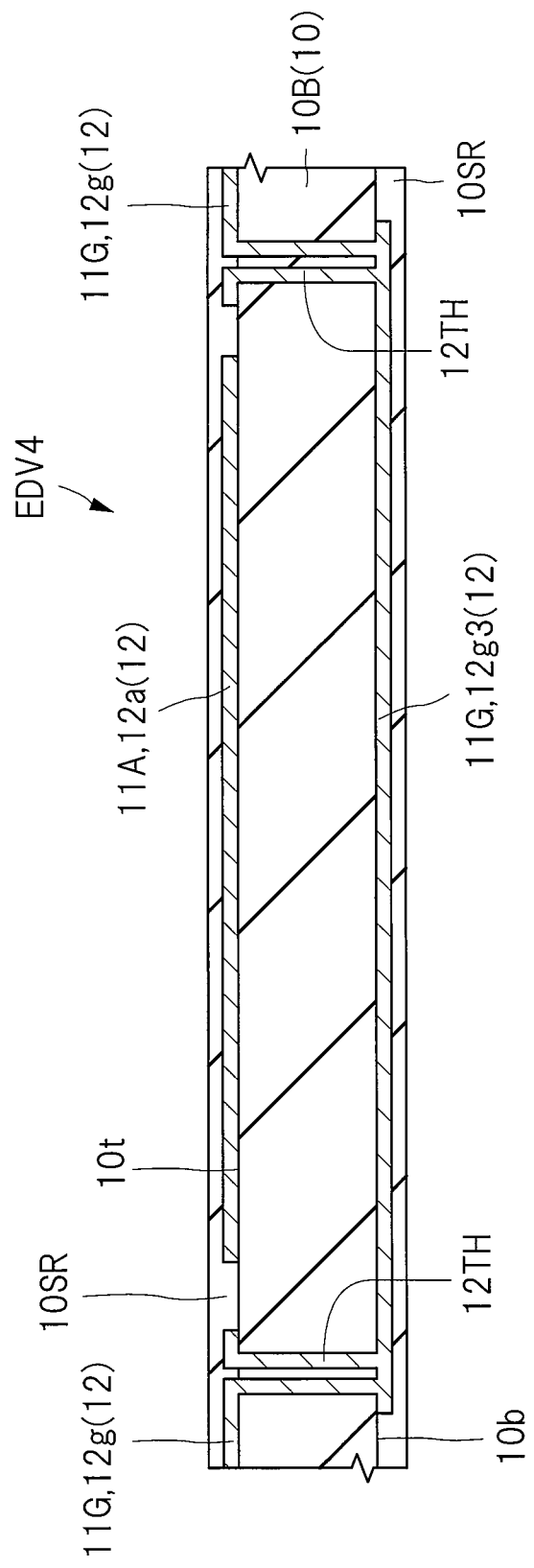
FIG. 16 is an enlarged sectional view taken along a wiring indicated as a wiring 12g3 among wirings for reference potential shown in FIG. 15.

Additionally, in the electronic devices EDV1, EV2, and EDV3 described above, explained have been the embodiments in which each of the plural wirings connecting the external terminal 60 and the semiconductor device 20 is formed on the one main surface 10t of the wiring substrate 10, and is not formed on the main surface 10b (see FIG. 4) opposite thereto. However, like an electronic device EDV4 shown by FIG. 15, a part of the wiring 12 may be formed on a surface other than the main surface 10t. FIG. 15 is a plan view showing a modification example of the electronic device shown in FIG. 14. FIG. 16 is an enlarged sectional view taken along a wiring indicated as a wiring 12g3 among wirings for reference potential shown in FIG. 15. Incidentally, in order to make it easy to see, FIG. 15 schematically shows, by dash-double-dot lines, wirings 12g3 and 12g4 formed on a surface other than the main surface 10t of the wiring substrate 10. However, widths of the wirings 12g3 and 12g4 are the same as a width of the wiring 12g shown by FIG. 15.

The electronic device EDV4 is different from the electronic device EDV3 shown by FIG. 14 in that some of the plural wirings 12 are formed on the main surface 10b (see FIG. 16) of the wiring substrate 10. More specifically, a circuit(s) that the electronic device EDV4 has is the same as that of the electronic device EDV4 shown by FIG. 14. However, the electronic device EDV4 is different from the electronic device EDV3 shown by FIG. 14 in the layout of the semiconductor device 20A. Depending on this, the electronic device EDV4 is different from the electronic device EDV3 also in layout of the plural wirings 12.

In an example show by FIG. 15, some of the plural connections 13 are provided on an extended line of the wiring 12g that extends along the wiring 12v supplying the power supply potential. For this reason, to circumvent the wiring 12g becomes necessary so that the wiring 12g and the connection 13v do not contact with each other. Here, in a plan view as shown by FIG. 15, in the case of the wiring 12g3 placed so as to circumvent the semiconductor device 20A, the wiring path distance from the connection 14g with the capacitor 30vg to the connection 13g with the semiconductor device 20A is longer than the wiring path distance from the connection 14v to the connection 13v. Therefore, a part of the reference potential line 11G in the electronic device EDV4 is formed on a surface (a main surface 10b shown by FIG. 16) other than the main surface 10t, and a difference between the wiring path distances is made small. That is, the wiring path from the connection 14g with the capacitor 30vg to the connection 13g with the semiconductor device 20 is electrically connected via the wiring 12g4. This makes it possible to shorten the wiring path distance between the capacitor 30vg and the semiconductor device 20A on the paired wiring paths composed of the power supply line 11V and the reference potential line 11G, so that the phase difference between the wiring paths can be reduced.

Additionally, in the case shown by FIG. 15, some of the plural connections 13v are provided on an extended line of the wiring 12a transmitting an output potential. For this reason, to circumvent the wiring 12a becomes necessary so that the wiring 12a and the connection 13v do not contact with each other. Here, as described above, if the wiring path distance between the connections 13a and 14a is fully short on the output line 11A, the wiring path distance between the connections 14a and 15a may be long. However, in this case, the wirings 12 to be paired are preferably arranged so as to extend along each other in order to reduce the phase difference occurring between the wiring paths to be paired.

Therefore, the wiring 12a in the electronic device EDV1 is formed so as to circumvent a circumference of the semiconductor device 20A in a plan view as shown by FIG. 15. Apart (wiring 12g3) of the reference potential line 11G to be paired with the output line 11A overlaps with the wiring 12a in a thickness direction as shown in FIGS. 15 and 16. In other words, the wirings 12a and 12g3 run in parallel via a base material 10B of the wiring substrate 10 as shown in FIG. 16. For this reason, the wiring path distance between the connections 14a and 15a becomes long, but the phase difference occurring between the output line 11A and the reference potential line 11G to be paired is reduced.

Incidentally, as shown in FIG. 16, the wiring 12g formed on the main surface 10b and the wiring 12g3 formed on the main surface 10t are electrically connected via through-hole wirings 12TH, each of the through-hole wirings being a conductor pattern embedded in a through hole that penetrates from one of the main surfaces 10t and 10b toward the other. The wiring 12g4 shown in FIG. 15 is not illustrated by a sectional view, but is electrically connected to the wiring 12g on the main surface 10t side via the through-hole wiring 12TH similarly to the wiring 12g3 shown in FIG. 16.

Additionally, a further modification example with respect to the electronic device EDV4 is omitted from the drawing, but may have a structure in which the part of the output line 11A is formed on a surface (e.g., main surface 10b shown in FIG. 16) other than the main surface 10t, and a wiring (s) for the output line 11A is provided so as to extend along the wiring 12g4 shown in FIG. 15. However, the through-hole wiring 12TH is different from other wiring 12 in a structure, and so easily becomes impedance discontinuities in which the impedance varies on the way of the wiring path. Therefore, the output line 11A or power supply line 11V is particularly preferably drawn around only on the main surface 10t side on which the semiconductor device 20A and the capacitor 30 are mounted. In other words, the wiring 12a constituting the output line 11A and the wiring 12v constituting the power supply line 11V are not preferably formed on the main surface 10b shown in FIG. 16.

Figure 17:
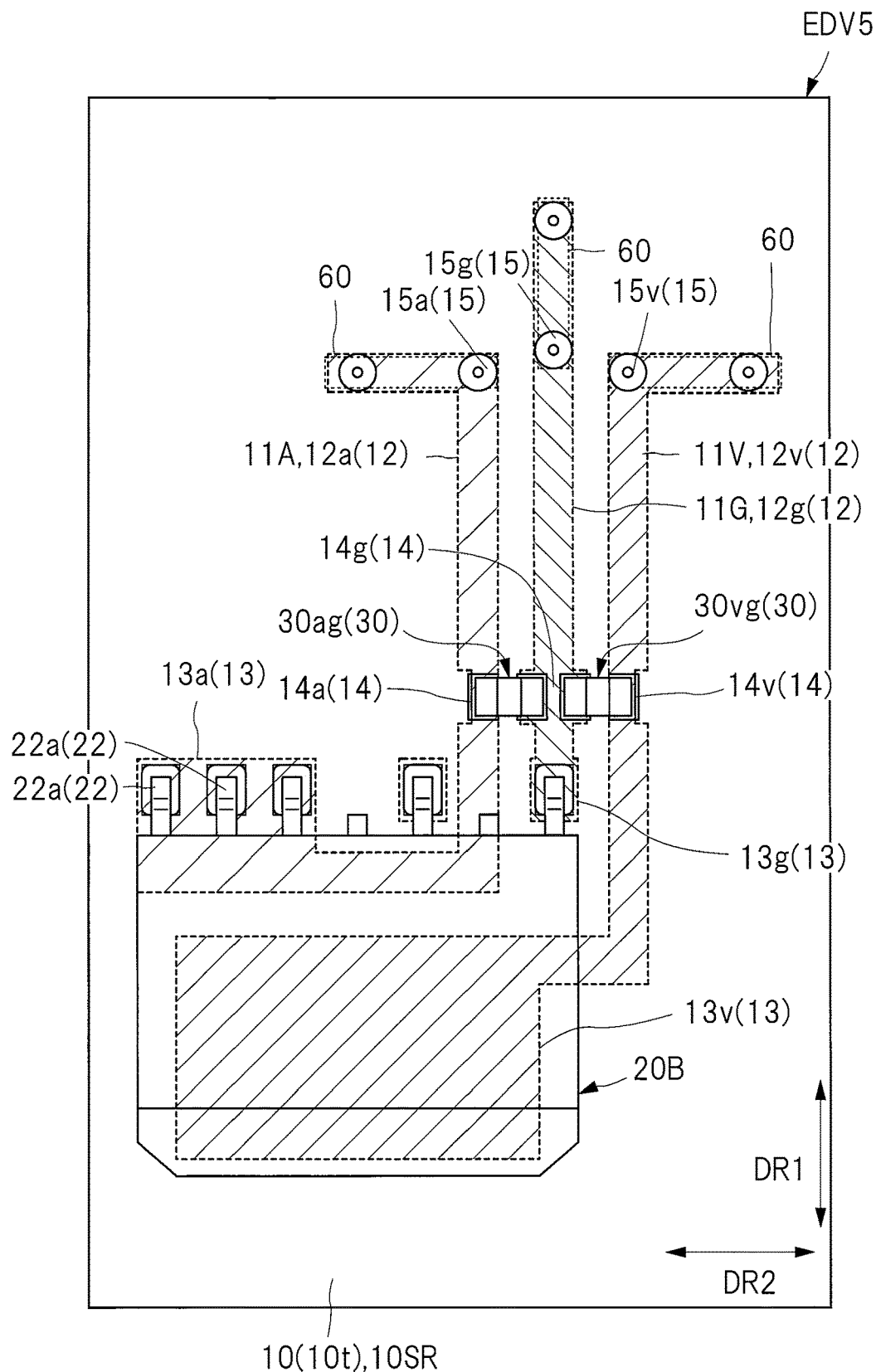
FIG. 17 is a plan view showing another modification example with respect to FIG. 3.

Additionally, like an electronic device EDV 5 shown by FIG. 17, a plurality of capacitors for noise measures may be arranged so as to adjacent to each other. FIG. 17 is a plan view showing another modification example with respect to FIG. 3. The electronic device EDV5 has a structure in which a capacitor 30ag mounted across the paired wiring paths composed of the output line 11A and the reference potential line 11G and a capacitor 30vg mounted across the paired wiring paths composed of the power supply line 11V and the reference potential line 11G are arranged so as to be adjacent to each other.

In this case, as shown in FIG. 17, the connection 14g connected to the capacitor 30ag and the connection 14g connected to the capacitor 30vg also serve as each other on the wiring 12g. In other words, the capacitor 30ag is mounted on a part of the connection 14g that the wiring 12g has, and the capacitor 30vg is mounted on the other part of the connection 14g. In this case, an area of the connection 14g needs to be made large depending on each planar size of the capacitors 30ag and 30vg. For this reason, in an example shown by FIG. 17, a width (a length of the connection 14g in a direction DR2 shown by FIG. 17) of the connection 14g connected to the electrode of the capacitor 30 is larger than a width (a length of the extension portion of the wiring 12g in the direction DR2) of the extension portion of the wiring 12g. Thus, when a plurality of capacitors 30 are arranged so as to be adjacent to each other, it is difficult to cause the propagation of noise without interposing the capacitor 30 even if the width of the connection 14g becomes larger than the width of the extension portion. For this reason, the width of the connection 14g in the electronic device EDV5 becomes larger than the width of the extension portion, so that mounting reliability of the plural capacitors 30 can be improved.

Incidentally, in the electronic device EDV5, the respective widths of the extension portions of the plural wirings 12 are made equal to each other, but the widths of the extension portions of some (e.g., wiring 12g) of the plural wirings 12 may be made larger than the widths of the extension portions of the other wirings 12. In this case, the embodiment may have a structure in which the plural capacitors 30 are arranged so as to be adjacent to each other and/or so that the width of the connection 14g becomes narrower than the width of the extension portion of the connection 12g.

However, when the width of the extension portion of the wiring 12 is larger than the width of the extension portion of the other wiring 12, impedance of the wider wiring 12 is lower than impedance of the other wiring 12. Then, if an impedance difference between the wiring paths to be paired becomes significant, this causes occurrence of the phase difference. Therefore, when the widths of the extension portions of some of the plural wirings 12 are large, it is preferable that measures (e.g., measures of lengthening the wiring path distance to increase etc. wiring inductance) of increasing the impedance of the relatively wide wiring 12 are taken, and impedance values are made close to each other.

Additionally, a semiconductor device 20B, which the electronic device EDV5 shown in FIG. 17 has, includes a plurality of terminal 22a for output arranged so as to be adjacent to each other. Thus, when the plural terminals 22 are arranged so as to be adjacent to each other, the plural terminals 22a may be connected to the one connection 13a by increasing an area of the connection 13 of the wiring 12a. In an example shown by FIG. 17, since the wiring path distance from the connection 13g of the wiring 12g to the connection 14g is short, a difference between it and the wiring path distance from the connection 13a to the connection 14a becomes significant. As described above, if the wiring path distance from the connection 13a to the connection 14a is fully short, the phase difference between the wiring path distances to be paired is difficult to make significant. However, an area of the connection 13g constituting the output line 11A having the relatively long wiring path distance is configured like the electronic device EDV5 so as to be made larger than that of the connection 13g of the reference potential line 11G having a relatively short wiring path distance, so that the impedance of the output line 11A can be reduced. As a result, the phase difference occurring between the output line 11A and the reference potential line 11G can be reduced. Similarly, in the case of the electronic device EDV5, an area of the connection 13v constituting the power supply line 11V is larger than an area of the connection 13g. Therefore, the phase difference occurring between the power supply line 11V and the reference potential line 11G can be reduced.

Figure 18:
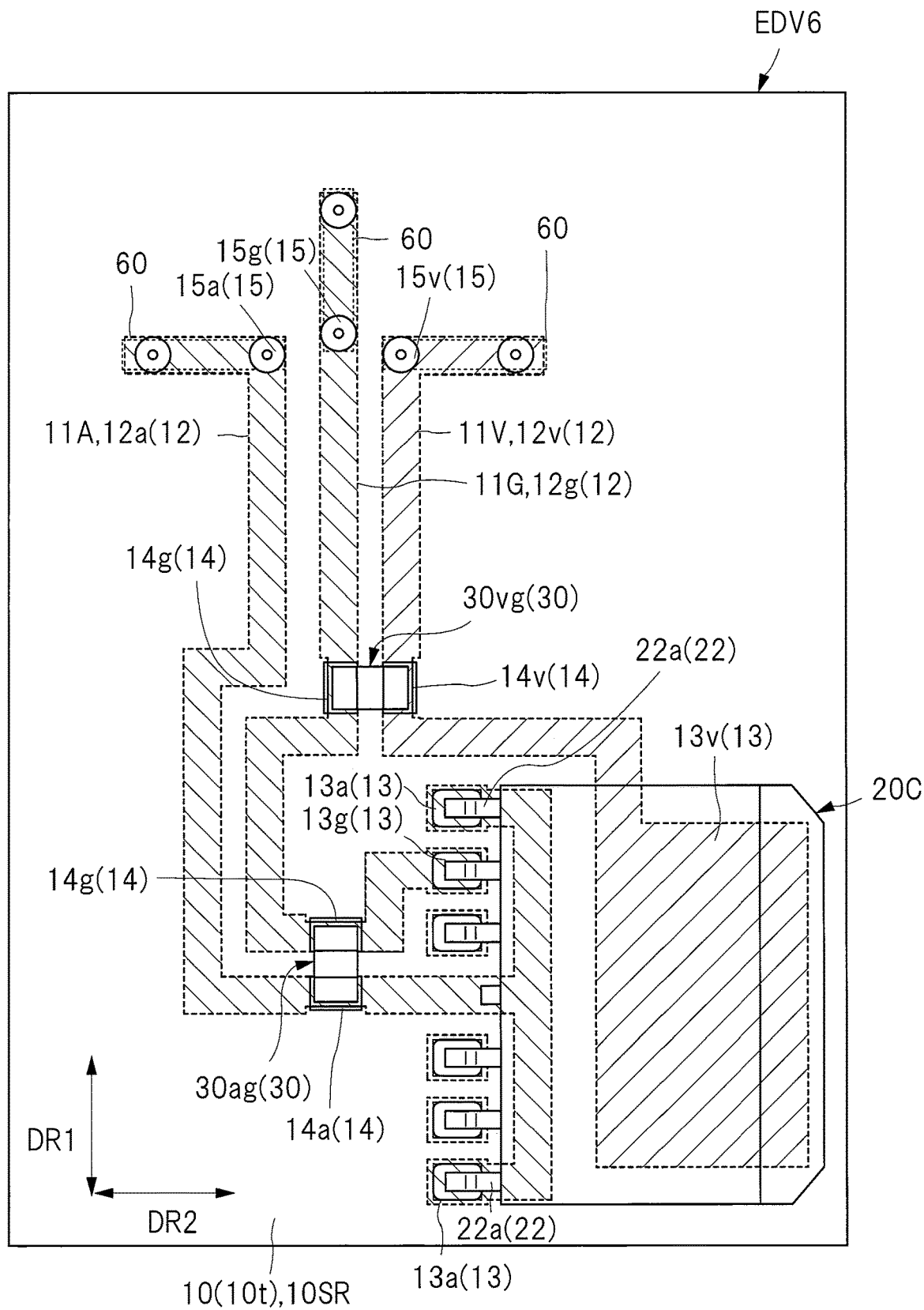
FIG. 18 is a plan view showing another modification example with respect to FIG. 3.
Figure 19:
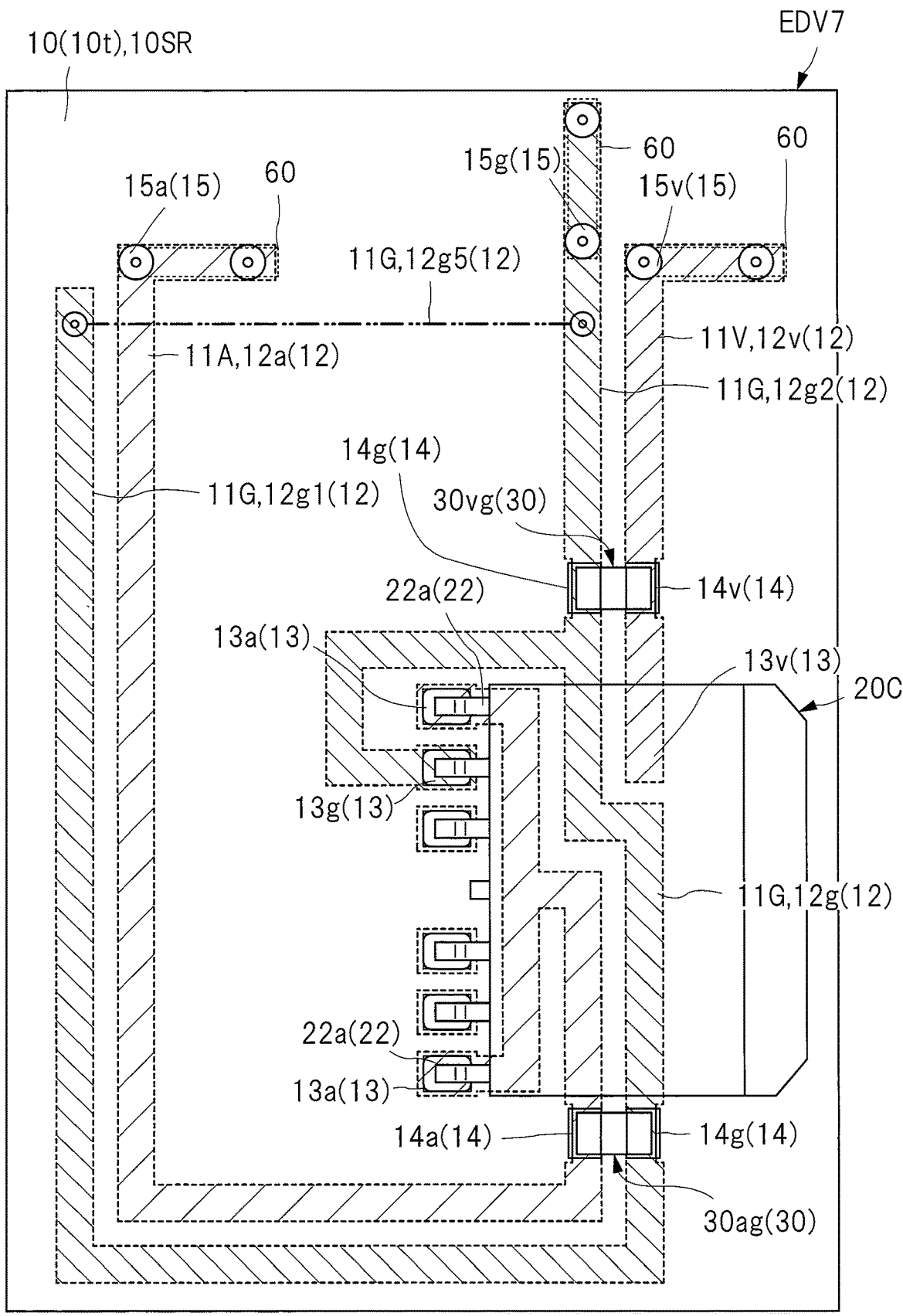
FIG. 19 is a plan view showing another modification example with respect to FIG. 3.

Further, similarly to a semiconductor device 20C that an electronic device EDV6 shown by FIG. 18 or an electronic device EDV7 shown by FIG. 19 has, when the semiconductor device 20C has a plurality of terminals 22a for output potential and the same potential is outputted from the each of the plural terminals 22a, the output line 11A may be branched. FIGS. 18 and 19 are plan views each showing another modification example with respect to FIG. 3.

In examples shown by FIGS. 18 and 19, the output line 11A is branched between the connection 14a and the plural connections 13a. In a case of the electronic device EDV6 shown by FIG. 18, the wiring 12g also serves as the wiring path distance to be paired with the power supply line 11V and the wiring path distance to be paired with the output line 11A. For this reason, since an occupied area of the wiring 12 is smaller than that of the electronic device EDV7 shown by FIG. 19, so that the electronic device EDV6 can be miniaturized.

Meanwhile, the electronic device EDV6 shown in FIG. 19 has a wiring 12g1 to be paired with the output line 11A, and a wiring 12g2 to be paired with the power supply line 11V. Thus, since each of the wirings 12g1 and 12g2 is formed, a degree of freedom of wiring layout is improved. Additionally, the wirings 12g1 and 12g2 are electrically connected to each other at a position overlapping with the semiconductor device 20C. For this reason, a wiring 12g for reference potential is provided along a portion between the connections 14a and 13a on the wiring 12a for output. Therefore, in the electronic device EDV7, the phase difference between the wiring paths can be reduced between the connections 13a and 14a in comparison with the electronic device EDV6.

Additionally, as shown in FIG. 19, the wirings 12g1 and 12g2 in the electronic device EDV7 are connected to each other via a wiring 12g5 that is formed on a surface (e.g., the main surface opposite to the main surface 10t) other than the main surface 10t. Thus, if the wirings 12g1 and 12g2 are electrically connected, they can also serve as the external terminal 60 for reference potential.

Figure 20:
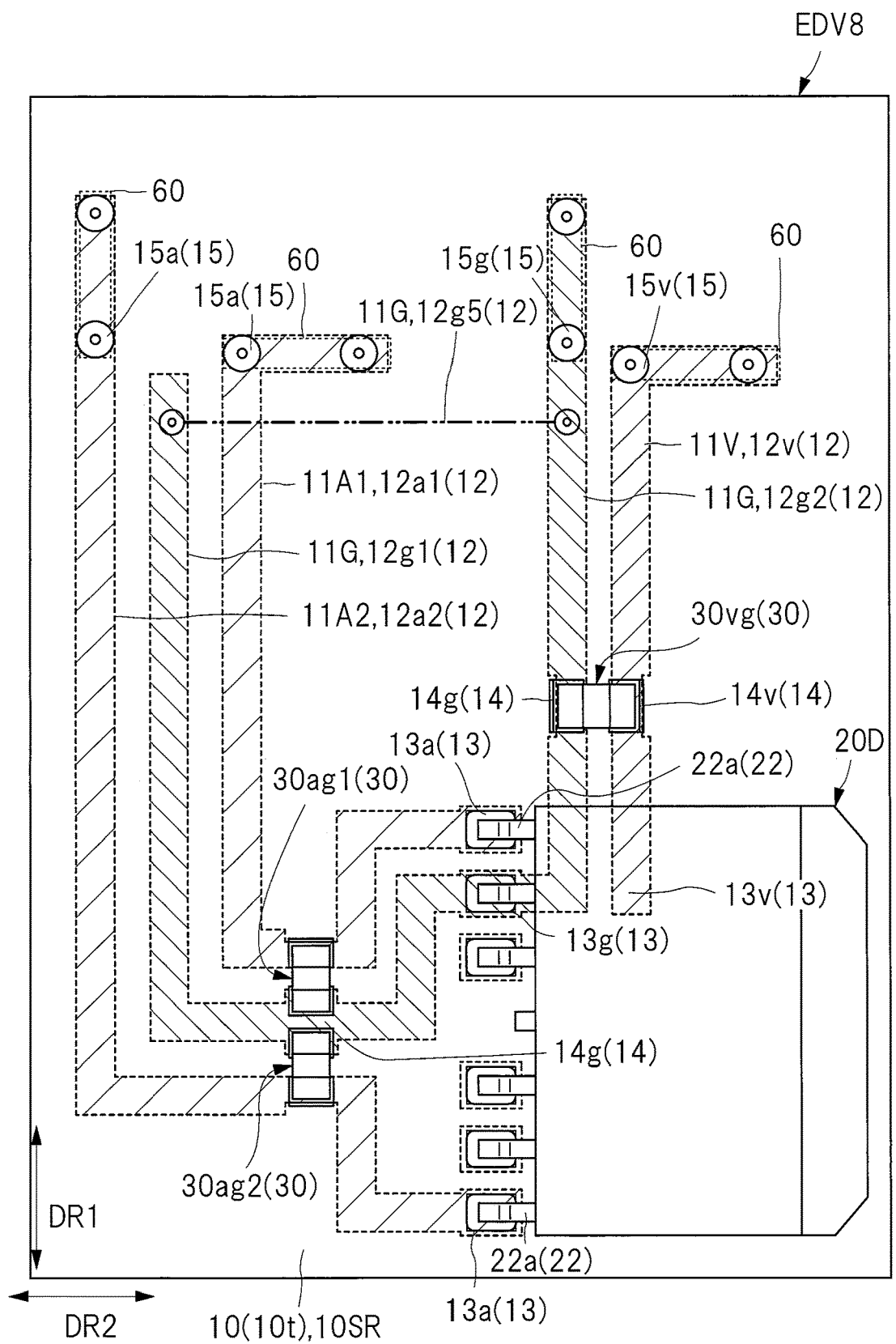
FIG. 20 is a plan view showing a modification example with respect to FIG. 18.

Additionally, similarly to a semiconductor device 20D that an electronic device EDV8 shown in FIG. 20 has, when potentials different from each other are outputted from each of the plural terminals 22a, the electronic device EDV8 may have the output lines 11A1 and 11A2 electrically separated from each other. FIG. 20 is a plan view showing a modification example with respect to FIG. 18.

The semiconductor device 20D that the electronic device EDV8 has outputs, from the plural terminals 22a, potentials different from each other. In this case, the semiconductor device 20D needs to have the output lines 11A1 and 11A2 electrically separated from each other. Additionally, when the wirings 12 to be paired are formed on each of the output lines 11A1 and 11A2, a wiring density becomes high and restriction of layout becomes large. Therefore, a reference potential line 11G is placed between the output lines 11A1 and 11A2 that the electronic device EDV8 has. Further, each of wiring 12a1 of the output line 11A1 and the wiring 12a2 of the output line 11A2 extends so as to be respectively parallel to the wiring 12g1 of the reference potential line 11G.

Additionally, in the electronic device EDV8, a capacitor 30ag1 mounted across the paired wiring paths composed of the output line 11A1 and the reference potential line 11G and a capacitor 30ag2 mounted across the paired wiring paths composed of the power supply line 11V and the reference potential line 11G are arranged so as to be adjacent to each other.

In a case of the electronic device having the plural output lines 11A1 and 11A2 similarly to the electronic device EDV8, an increase in the wiring density can be suppressed by also serving as the wiring 12g1 to be paired with each of the plural output lines 11A1 and 11A2. Additionally, in an example shown by FIG. 20, the wirings 12g2 and 12g1 are electrically connected to each other via a wiring 12g5. For this reason, the electronic device EDV1 can suppress an increase of the number of external terminals 60.

Further, explained in the above embodiment and various modification examples has been an aspect in which the capacitor 30 is mounted across the two wirings 12 extending along each other. However, as a modification example, a not-shown lead-out wiring is connected to two wirings, and a part of the lead-out wiring may be provided with the connection 14. In this case, a distance between the two wirings can be set regardless of an outline size of the capacitor 30. However, as explained in the above embodiment, from the viewpoint of reducing the noise transmitted without interposing the capacitor 30, the connection 14 is preferably provided on the way of an extension direction of the wiring 12. In other words, the capacitor 30 is preferably mounted across the two wirings.

Additionally, in the above embodiment, the example in which the wiring path distance of the wiring path for connecting the capacitor 30 and the semiconductor device 20 is shorter than the wiring path distance connecting the capacitor 30 and the external terminal 60 has been explained with reference to, for example, FIG. 9, and lengths of the wirings 12 that the wiring substrate 10 has are compared. More specifically, compared are the wiring path distance 11a1 between the connections 13a and 14a of the wiring 12a shown in FIG. 9, the wiring path distance 11a2 between the connections 15a and 14a, the wiring path distance 11v1 between the connections 13v and 14v of the wiring 12v, and the wiring path distance 11v2 between the connections 15v and 14v.

Figure 21:
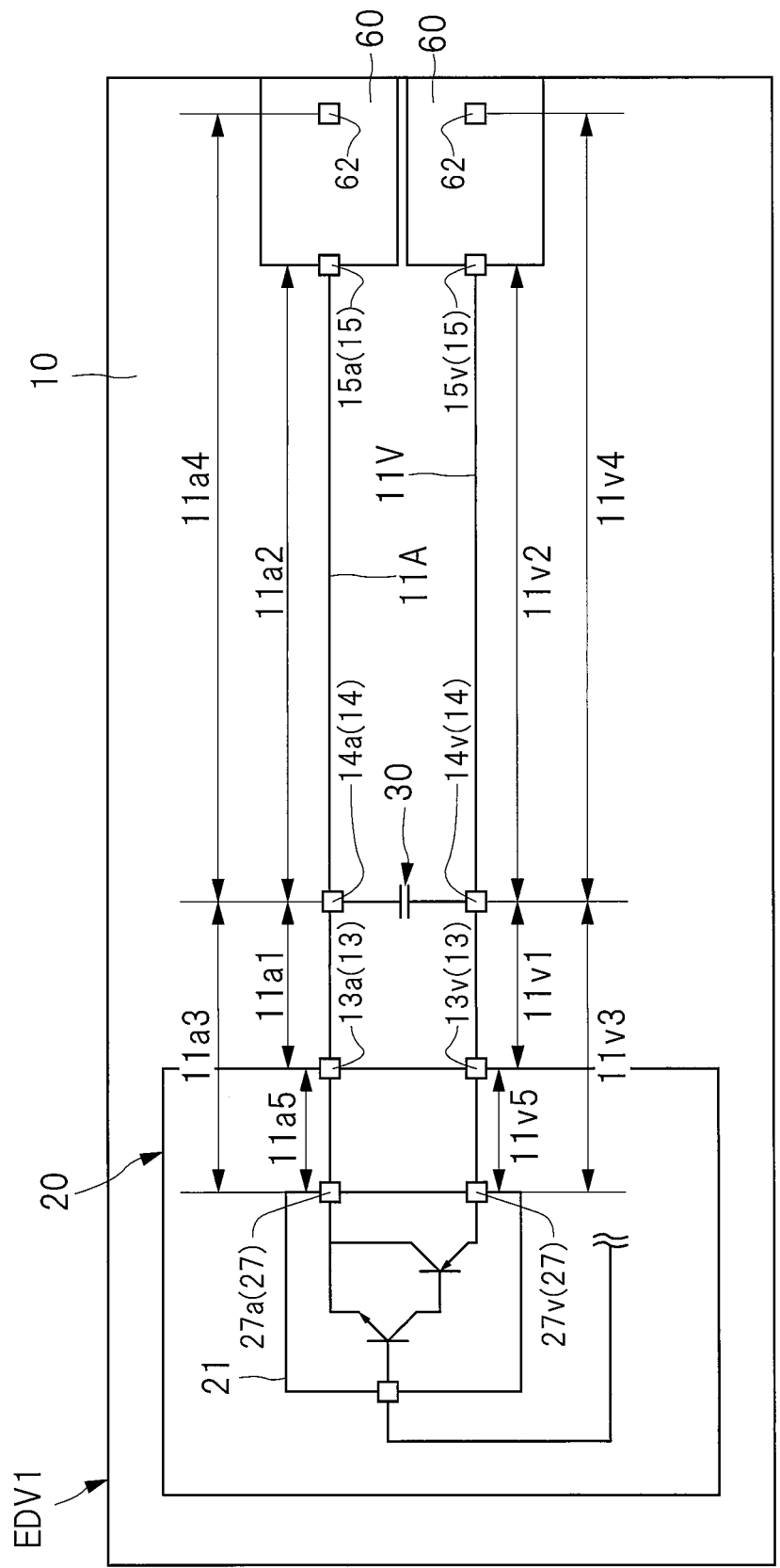
FIG. 21 is an explanatory diagram schematically showing a definition of a wiring path explained by using FIG. 9 and a definition of a wiring path different therefrom.
Figure 22:
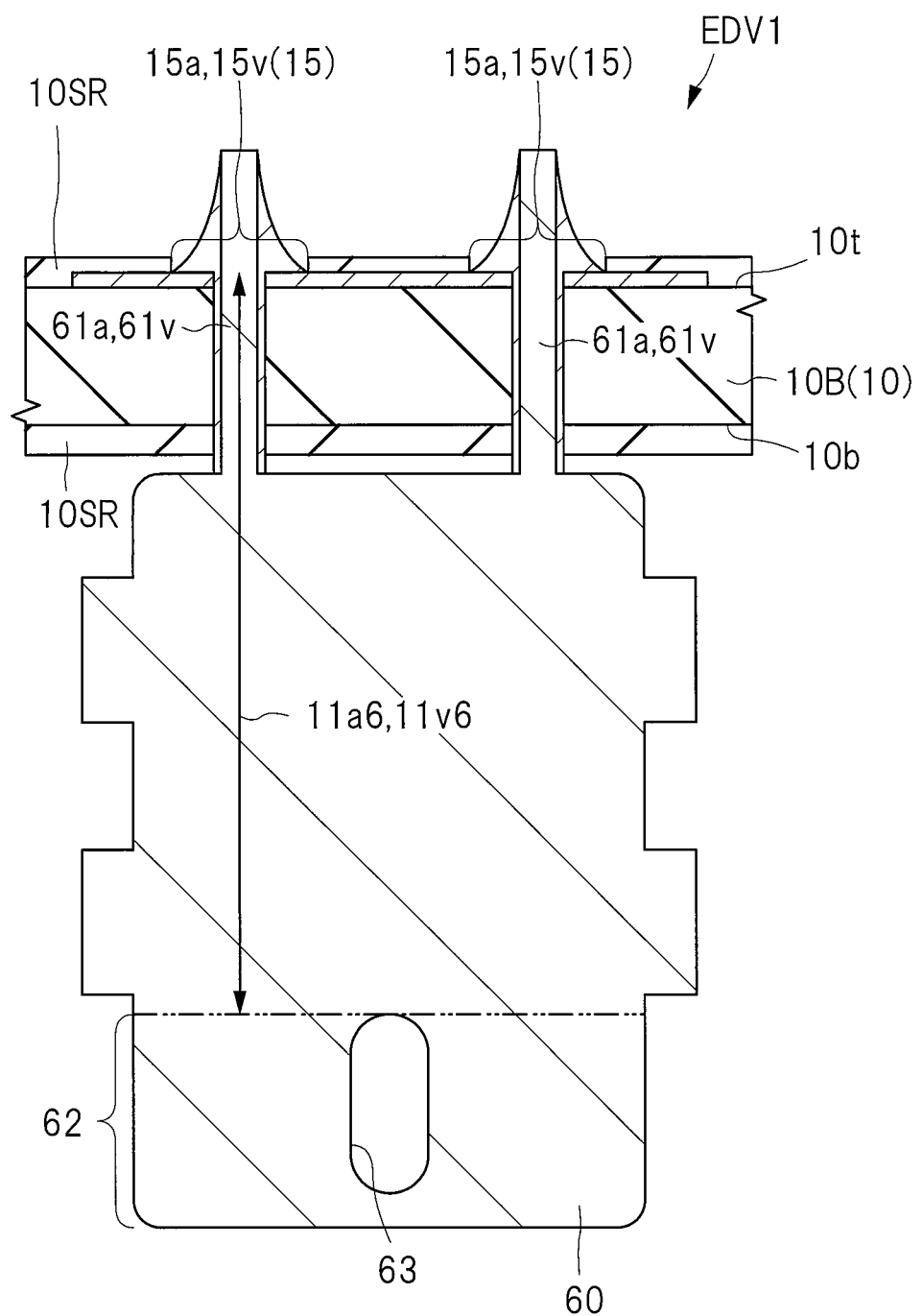
FIG. 22 is an enlarged sectional view schematically showing an example of a wiring path inside an external terminal shown by external terminals shown in FIG. 21.

However, it can be thought that the above wiring path distance includes a wiring path distance in the semiconductor device 20 and a wiring path distance in the external terminal 60 as shown in FIG. 21. FIG. 21 is an explanatory diagram schematically showing a definition of a wiring path explained by using FIG. 9 and a definition of a wiring path different therefrom. FIG. 22 is an enlarged sectional view schematically showing an example of a wiring path inside an external terminal shown by external terminals shown in FIG. 21. Incidentally, FIG. 21 corresponds to a circuit diagram shown in FIG. 8, but omits the capacitor 40, diode 50, and paths connected to those as shown in FIG. 8 in order to make it easy to see. Further, FIG. 22 shows, by a dash-double-dot line, a boundary for distinguishing between an external connection 62 to be connected to an external wiring (a wire shown in FIG. 1 or a contact conductor portion of a socket attached to a tip of the wire) and a section other than the external connection in the external terminal 60.

In an example shown by FIG. 21, each of wiring path distances 11a3 and 11v3 each electrically connecting the capacitor 30 and an electrode 27 of a semiconductor chip 21 in the semiconductor device 20 is shorter than each of wiring path distances 11a4 and 11v4 each electrically connecting the capacitor 30 and the external connection 62 of the external terminal 60.

In addition to the wiring path distance 11a1 explained with reference to FIG. 9, the wiring path distance 11a3 shown in FIG. 21 includes a wiring path distance 11a5 in the semiconductor device 20. The wiring path distance 11a5 includes a terminal (lead terminal) 22a shown in FIG. 3, and/or a not-shown conductive member (e.g., wire etc.) connecting the terminal 22a and an electrode 27a (see FIG. 21) of the semiconductor chip 21.

Similarly, in addition to the wiring path distance 11v1 explained with reference to FIG. 9, the wiring path distance 11v3 shown in FIG. 21 includes a wiring path distance 11v5 in the semiconductor device 20. In the example shown by FIG. 5, since an electrode 27v shown in FIG. 21 is formed on a back surface of the semiconductor chip 21, the wiring path distance 11v5 includes conductive members such as the solder material 26, die pad 24, and die bond material 25.

Additionally, in addition to the wiring path distance 11a2 explained with reference to FIG. 9, the wiring path distance 11a4 shown in FIG. 21 includes a wiring path distance 11a6 in the external terminal 60. Similarly, in addition to the wiring path distance 11v2 explained with reference to FIG. 9, the wiring path distance 11v4 shown in FIG. 21 includes a wiring path distance 11v6 in the external terminal 60. Further, as shown in FIG. 22, the wiring path distance 11a6 is defined as a distance from a connection portion with the connection 15a in an electrode 61a to the external connection 62. A wiring path distance 11v6 is defined as a distance from a connection portion with the connection 15v in the electrode 61a to the external connection 62.

Similarly to an example shown by FIG. 22, when a through hole 63 is provided in a part of the external terminal 60, some (a wire shown by FIG. 1 or a contact conductor portion of a not-shown socket attached to a tip of the wire)

of the external wring contact with a circumference of the through hole 63. For example, when a contact conductor portion (omitted in the drawing) of a not-shown socket attached to a tip of a wire shown in FIG. 1 is brought into contact with the external terminal 60, the socket is attached so as to cover the circumference of the through hole 63, and the socket and the external terminal 60 are fixed by inserting a not-shown protrusion (omitted in the drawing) into the through hole 63. In this time, the contact conductor portion (e.g., metal plate or metal film) connected to the wire is formed inside the socket, and the contact conductor portion and the external terminal 60 contact with each other in the external connection 62 around the through hole 63. Or, for example, when the wire is wound directly around the external terminal 60, a part of the wire is inserted into the through hole 63, and the wire is wound around the external connection 62 around the through hole 63. Therefore, a portion from the external connection 62 to the connection 15 in the external terminal 60 shown in FIG. 22 can be thought to a part of the wiring path distance electrically connected to the semiconductor device 20 and the a wire(s) outside the electronic device EDV1.

Additionally, the modification examples can be combined and applied within a range not departing from the gist of technical ideas that have been explained in the above embodiment.

Besides, a part of contents having been described in the above embodiment will be described below.

EXPLANATION OF REFERENCE CHARACTERS

10, 10*h* wiring substrate;
10*b* main surface (surface, back surface, lower surface, external-terminal mounting surface);
10B base material;
10SR insulating film;
10*t* main surface (surface, front surface, upper surface, semiconductor-device mounting surface);
11A, 11A1, 11A2 output line (wiring path);
11*a*1, 11*a*2, 11*a*3, 11*a*4, 11*a*5, 11*a*6, 11*v*1, 11*v*2, 11*v*3, 11*v*4, 11*v*5, 11*v*6 wiring path distance;
11E wiring path;
11G reference potential line (wiring path, input line);
11V power supply line (wiring path);
12 wiring;
12*a* wiring;
12A wiring;
12*a*, 12*a*1, 12*e*, 12*g*, 12*g*1, 12*g*2, 12*g*3, 12*g*4, 12*g*5, 12*v* wiring;
12*ha*, 12*hv*, 12*he* conductor pattern;
12*hv* conductor pattern;
12*jc* branch portion;
12TH through-hole wiring;
13, 13*a*, 13*e*, 13*g*, 13*v* connection (device connection);
13*wa*, 13*wv*, 14*wa*, 14*wa*, 14*wv*, 17*wa*1, 17*wa*2, 17*wv*1, 17*wv*2 width;
14, 14*a*, 14*g*, 14*v* connection (capacitor connection);
15, 15*a*, 15*g*, 15*v* connection (external-terminal connection);
16 connection (electronic-device connection);
17*a*1, 17*a*2, 17*v*1, 17*v*2 extension portion;
20, 20A, 20B, 20C, 20D semiconductor device;
20 semiconductor chip;
22, 22*a*, 22*e*, 22*g*, 22*v* terminal (device terminal, lead terminal);
23 sealing body (resin body);
24 die pad;
25 die bond material;
26 solder material;
27*a*, 27*v* electrode;
30, 30*ag*, 30*ag*1, 30*ag*2, 30*vg* capacitor (chip capacitor);
30C, 30E characteristic curve;
30CP, 30CPh, 30EP, 30EPh peak;
31, 31*a*, 31*g*, 31*v* electrode;
32 main body;
33 insulating layer (dielectric layer);
34 conductor plate;
40 capacitor;
41 electrode;
50 diode;
60 external terminal (connector);
61*a*, 61*v* electrode (pin);
62 external connection;
COM1 component;
DR1, DR2 direction;
EDV1, EDV2, EDV3, EDV4, EDV5, EDV6, EDV7, EDV8, Eh1, Eh2 electronic device;
GND reference potential;
HAR1, HAR2, HAR3, HAR4, HAR1 wire;
IJP1 coil (injection probe);
LAM1 lamp;
LISN1 artificial mains network;
OUT output potential (or output signal);
PWS1, PWS2 power supply; and
Vcc power supply potential.

The invention claimed is:

1. An electronic device comprising:
a wiring substrate including a first main surface, a first wiring formed on the first main surface, a second wiring formed on the first main surface, and a second main surface opposite to the first main surface;
a semiconductor device mounted on the first main surface of the wiring substrate, the semiconductor device including a semiconductor chip, a first terminal electrically connected with the semiconductor chip, and a second terminal electrically connected with the semiconductor chip; and
a first capacitor mounted on the first main surface of the wiring substrate, the first capacitor including a first electrode and a second electrode,
wherein the first wiring has:
a first device connecting portion, with which the first terminal of the semiconductor device is electrically connected,
a first capacitor connecting portion, with which the first electrode of the first capacitor is electrically connected,
a first external-terminal connecting portion located farther than the first device connecting portion from the first capacitor connecting portion,
a first extending portion connected between the first device connecting portion and the first capacitor connecting portion, and
a second extending portion connected between the first capacitor connecting portion and the first external-terminal connecting portion,
wherein the second wiring has:
a second device connecting portion, with which the second terminal of the semiconductor device is electrically connected,
a second capacitor connecting portion, with which the second electrode of the first capacitor is electrically connected, a second external-terminal connecting portion located farther than the second device connecting portion from the second capacitor connecting portion, a third extending portion connected between the second device connecting portion and the second capacitor connecting portion, and a fourth extending portion connected between the second capacitor connecting portion and the second external-terminal connecting portion, wherein the first capacitor connecting portion is located on a path from the first device connecting portion to the first external-terminal connecting portion, wherein the second capacitor connecting portion is located on a path from the second device connecting portion to the second external-terminal connecting portion, wherein a length of the first extending portion that serves as a first wiring path between the first device connecting portion and the first capacitor connecting portion is shorter than a length of the second extending portion that serves as a second wiring path between the first external-terminal connecting portion and the first capacitor connecting portion, wherein a length of the third extending portion that serves as a third wiring path between the second device connecting portion and the second capacitor connecting portion is shorter than a length of the fourth extending portion that serves as a fourth wiring path between the second external terminal connecting portion and the second capacitor connecting portion, wherein the length of the first extending portion and the length of the third extending portion are different from each other, wherein at least part of the first wiring is arranged along at least part of the second wiring, wherein a width of the first capacitor connecting portion is less than a width of each of the first extending portion and the second extending portion, wherein a width of the second capacitor connecting portion is less than a width of each of the third extending portion and the fourth extending portion, and wherein the width of the first extending portion, the width of the second extending portion, the width of the third extending portion, and the width of the fourth extending portion are substantially the same as one another.

2. The electronic device according to claim 1, wherein the width of the first capacitor connecting portion is less than each of a width of the first device connecting portion, the width of the first extending portion, the width of the second extending portion and a width of the first external-terminal connecting portion, and wherein the width of the second capacitor connecting portion is less than each of a width of the second device connecting portion, the width of the third extending portion, the width of the fourth extending portion and a width of the second external-terminal connecting portion.

3. The electronic device according to claim 2, wherein one of an oscillator circuit having two bipolar transistors and a metal oxide semiconductor field effect transistor (MOSFET) is formed in the semiconductor chip.

4. The electronic device according to claim 3, wherein a second capacitor including a third electrode and a fourth electrode is mounted on the wiring substrate, wherein the wiring substrate includes a third wiring formed on the first main surface, wherein the first wiring has a third capacitor connecting portion with which the third electrode of the second capacitor is electrically connected, wherein the third wiring has:

a third device connecting portion, with which a third terminal of the semiconductor device is electrically connected, and a fourth capacitor connecting portion, with which the fourth electrode of the second capacitor is electrically connected, and wherein the third capacitor connecting portion is located on said path from the first device connecting portion to the first external-terminal connecting portion, and is located between the first capacitor connecting portion and the first external-terminal connecting portion.

5. The electronic device according to claim 4, wherein the second capacitor is mounted on the second main surface of the wiring substrate, wherein the first capacitor is a ceramic capacitor, and wherein the second capacitor is an electrolytic capacitor.

6. The electronic device according to claim 4, wherein the second capacitor is mounted on the second main surface of the wiring substrate, wherein a volume of the first capacitor is smaller than a volume of the second capacitor, and wherein a mounting area of the first capacitor is smaller than a mounting area of the second capacitor.

7. The electronic device according to claim 4, wherein the second capacitor is mounted on the second main surface of the wiring substrate, and wherein a capacity of the first capacitor is less than a capacity of the second capacitor.

8. The electronic device according to claim 7, wherein the capacity of the first capacitor is about 0.1 µF to 10 µF, and wherein the capacity of the second capacitor is about 22 µF to 100 µF.

9. The electronic device according to claim 3, wherein a diode, including a fifth electrode and a sixth electrode, is mounted on the second main surface of the wiring substrate, wherein the first wiring has a first diode connecting portion, with which the fifth electrode of the diode is electrically connected, and wherein the second wiring has a second diode connecting portion, with which the sixth electrode of the diode is electrically connected.

10. The electronic device according to claim 3, wherein a first external-terminal, including a seventh electrode electrically connected with the first external-terminal connecting portion of the first wiring, and a second external-terminal, including an eighth electrode electrically connected with the second external-terminal connecting portion of the second wiring, are mounted on the second main surface of the wiring substrate.

* * * * *